United States Patent
Watanabe et al.

(10) Patent No.: US 9,923,006 B2
(45) Date of Patent: Mar. 20, 2018

(54) OPTICAL DETECTION ELEMENT AND SOLID-STATE IMAGE PICKUP DEVICE

(71) Applicants: BROOKMAN TECHNOLOGY, INC., Shizuoka (JP); IKEGAMI TSUSHINKI CO., LTD., Tokyo (JP); JAPAN ATOMIC ENERGY AGENCY, Ibaraki (JP)

(72) Inventors: Takashi Watanabe, Shizuoka (JP); Tomohiro Kamiyanagi, Tokyo (JP); Kunihiko Tsuchiya, Ibaraki (JP); Tomoaki Takeuchi, Ibaraki (JP)

(73) Assignees: BROOKMAN TECHNOLOGY, INC., Shizuoka (JP); IKEGAMI TSUSHINKI CO., LTD., Tokyo (JP); JAPAN ATOMIC ENERGY AGENCY, Ibaraki (JP)

( * ) Notice: Subject to any disclaimer, the term of this patent is extended or adjusted under 35 U.S.C. 154(b) by 0 days.

(21) Appl. No.: 15/412,154

(22) Filed: Jan. 23, 2017

(65) Prior Publication Data
US 2017/0133419 A1 May 11, 2017

Related U.S. Application Data

(63) Continuation-in-part of application No. PCT/JP2015/003704, filed on Jul. 23, 2015.

(30) Foreign Application Priority Data

Jul. 25, 2014 (JP) .................................. 2014-151941

(51) Int. Cl.
*H01L 27/148* (2006.01)
*H01L 27/146* (2006.01)

(52) U.S. Cl.
CPC .. *H01L 27/14614* (2013.01); *H01L 27/14643* (2013.01)

(58) Field of Classification Search
CPC ............. H01L 27/14643; H01L 27/146; H01L 27/307; H01L 31/068; H01L 31/072;
(Continued)

(56) References Cited

U.S. PATENT DOCUMENTS

| 6,690,074 B1 | 2/2004 | Dierickx et al. |
| 2003/0057431 A1 | 3/2003 | Kozuka et al. |

(Continued)

FOREIGN PATENT DOCUMENTS

| JP | S60-65565 A | 4/1985 |
| JP | 2004-312039 A | 11/2004 |

(Continued)

OTHER PUBLICATIONS

The English translation of the international preliminary report on patentability (Chapter I) of PCT/JP2015/003704 mailed by the International Bureau of WIPO dated Feb. 9, 2017 (PCT/IB/338, PCT/IB/373 and PCT/ISA/237).

*Primary Examiner* — Sonya D McCall Shepard
(74) *Attorney, Agent, or Firm* — Metrolexis Law Group, PLLC

(57) ABSTRACT

A radiation tolerant optical detection element includes: a p-type base-body region; a gate insulating film provided on an upper surface of the base-body region; an n-type buried charge-generation region buried in an upper portion of the base-body region; an n-type charge-readout region buried in an upper portion of the base-body region on the inner-contour side of the buried charge-generation region; an n-type reset-drain region buried on the inner-contour side of the charge-readout region; a transparent electrode provided on the gate insulating film above the buried charge-genera- (Continued)

tion region; and a reset-gate electrode provided on a portion of the gate insulating film between the charge-readout region and the reset-drain region.

8 Claims, 12 Drawing Sheets

(58) Field of Classification Search
CPC . H01L 31/103; H01L 31/109; H01L 31/1124; H01L 31/1127; H01L 31/118; H01L 21/74; H01L 21/76; H01L 29/408; H01L 29/0661; H01L 29/0692; H01L 29/6634; H01L 29/7396; H01L 29/7811; H01L 25/167; H01L 31/125; H01L 31/153; H01L 31/173; H01L 27/153; G09F 9/33
See application file for complete search history.

(56) References Cited

U.S. PATENT DOCUMENTS

| | | |
|---|---|---|
| 2011/0024808 A1 | 2/2011 | Janesick |
| 2011/0049590 A1 | 3/2011 | Itonaga |
| 2011/0134298 A1 | 6/2011 | Aoyama |
| 2012/0193743 A1* | 8/2012 | Kawahito ......... H01L 27/14609 257/435 |

FOREIGN PATENT DOCUMENTS

| | | |
|---|---|---|
| JP | 2006-41189 A | 2/2006 |
| JP | 2011-49446 A | 3/2011 |
| WO | 2010/018677 A1 | 2/2010 |

\* cited by examiner

OPTICAL DETECTION ELEMENT AND SOLID-STATE IMAGE PICKUP DEVICE

CROSS-REFERENCE TO RELATED APPLICATIONS

This application is a continuation-in-part of International Application No. PCT/JP2015/003704, filed Jul. 23, 2015, which claims priority to Japanese Patent Application No. 2014-151941, filed Jul. 25, 2014. The contents of each of these applications are incorporated herein by reference in their entirety.

BACKGROUND OF THE INVENTION

1. Field of the Invention

The present invention relates to an optical detection element having radiation tolerance and a solid-state image pickup device having the radiation tolerance, in the solid-state image pickup device a number of pixels are arranged on a semiconductor chip using the optical detection element as the pixel.

2. Description of the Related Art

In pixels of a three-transistor CMOS solid-state image pickup device (hereinafter abbreviated as "3T type"), a photodiode is implemented by a p-n junction including a p-type semiconductor substrate and an n-type region disposed on the p-type semiconductor substrate. The n-type region sometimes has a double-layer structure including a buried n-type layer (n-well) having a low impurity concentration and an n-type layer having a high impurity concentration provided on the buried n-type layer. Since a pixel isolation insulating film is disposed in a peripheral portion of the photodiode and the pixel isolation insulating film is covered by a p-well, the p-well is inserted between the photodiode and the pixel isolation insulating film. Furthermore, a thick interlayer insulating film is provided on an upper surface of the photodiode and a wiring metal is disposed with the interlayer insulating film interposed between the photodiode and the wiring metal.

When gamma rays are irradiated to the 3T pixel, since the interface is activated and becomes the source of a large dark current, the dark current increases. The reason of the increment in the dark current is speculated as follows: when hydrogens are ionized by irradiation of gamma rays in a thick oxide film implementing the interlayer insulating film and the pixel isolation insulating film, because the ionized hydrogens diffuse through the oxide film to reach a semiconductor interface so that hydrogen gas is emitted, the hydrogen atoms suppressing the dark current on the interface are deprived.

Thus, a guard ring scheme, by which the periphery of a photodiode is surrounded by a MOS-type gate electrode and the outer side of the gate electrode is surrounded by a p-type guard ring region, is known as disclosed by U.S. Pat. No. 6,690,074. By applying a voltage, at a level by which the semiconductor surface will not be depleted, to the MOS-type gate electrode, the generation of a dark current in the peripheral portion of the photodiode can be suppressed. However, even by the invention disclosed in U.S. Pat. No. 6,690,074, since an issue of dark current, which will be generated in the interlayer insulating film disposed on the upper surface of the photodiode, still remains, the dark current increases with the amount of irradiation of gamma rays as illustrated in FIG. 13.

In pixels of a four-transistor CMOS solid-state image pickup device (hereinafter abbreviated as "4T type") in which a transistor having a transfer-gate electrode is added to the 3T structure, a structure in which a p-type pinning layer having a high impurity concentration is formed on a buried n-type layer is often employed for eliminating the influence of surface states. However, even when the p-type pinning layer is formed, the dark current increases abruptly with irradiation of gamma rays of 1 kGy or higher as illustrated in FIG. 13. It is predicted that, when gamma rays are irradiated, since an electron-hole pair is generated in a thick oxide film, slow holes remain, and excessive positive charges remain in the oxide film, the shielding effect of the p-type pinning layer disappears.

In any of the earlier 3T and 4T CMOS solid-state image pickup devices, the capacitance of the photodiode is large and the charge-voltage conversion gain is low. Therefore, there is a problem that the earlier CMOS solid-state image pickup device has very low voltage-sensitivity.

SUMMARY OF THE INVENTION

In view of the foregoing problem, an object of the present invention is to provide an optical detection element having a high voltage-sensitivity and a high radiation tolerance and a solid-state image pickup device having the high radiation tolerance, in which a number of pixels are arranged on a semiconductor chip using the optical detection element as the pixel.

In order to attain the object, a first aspect of the present invention inheres in an optical detection element encompassing (a) a base-body region made of a semiconductor having a first conductivity type, (b) a gate insulating film contacted with an upper surface of the base-body region, (c) a buried charge-generation region of a second conductivity type buried with an annular form in an upper portion of the base-body region, being contacted with the gate insulating film, (d) a charge-readout region of the second conductivity type having a higher impurity concentration than the buried charge-generation region, buried with an annular form in the upper portion of the base-body region at a position on an inner-contour side of the buried charge-generation region, (e) a reset-drain region of the second conductivity type having a higher impurity concentration than the buried charge-generation region, buried on the inner-contour side of the charge-readout region, being separated from the charge-readout region, (f) a transparent electrode provided in an annular form on a gate insulating film, allocated above the buried charge-generation region, and (g) a reset-gate electrode stacked on the gate insulating film, allocated above the base-body region between the charge-readout region and the reset-drain region. In the optical detection element according to the first aspect, a surface potential on the surface of the buried charge-generation region is pinned by charges of minority carriers in the buried charge-generation region.

A second aspect of the present invention inheres in a solid-state image pickup device in which a plurality of pixels is arranged, each pixel encompassing (a) a base-body region made of a semiconductor having a first conductivity type, (b) a gate insulating film contacted with an upper surface of the base-body region, (c) a buried charge-generation region of a second conductivity type buried with an annular form in an upper portion of the base-body region, being contacted with the gate insulating film, (d) a charge-readout region of the second conductivity type having a higher impurity concentration than the buried charge-generation region, buried with an annular form in the upper portion of the base-body region at a position on an inner-contour side of the buried charge-generation region, (e) a reset-drain region of the second conductivity type having a higher impurity concentration than the buried charge-generation region, buried on the inner-contour side of the charge-readout region, being separated from the charge-readout region, (f) a transparent electrode provided in an annular form on a gate insulating film, allocated above the buried charge-generation region, and (g) a reset-gate electrode stacked on the gate insulating film, allocated above the base-body region between the charge-readout region and the reset-drain region. In the solid-state image pickup device according to the second aspect of the present invention, in each of the plurality of arranged pixels, a surface potential on the surface of the buried charge-generation region is pinned by charges of minority carriers in the buried charge-generation region.

DESCRIPTION OF EMBODIMENTS

Figure 1:
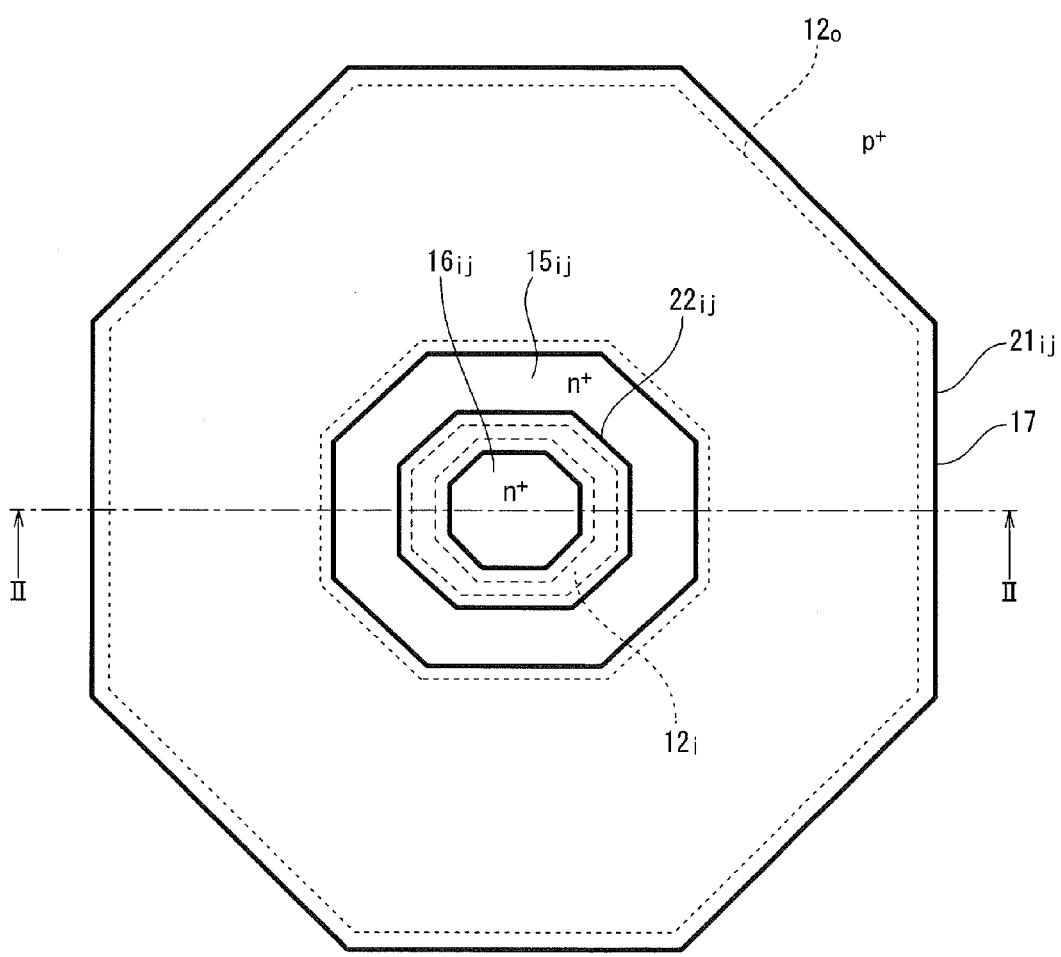
FIG. 1 is a schematic plan view illustrating a schematic structure of a main part of an optical detection element according to a first embodiment of the present invention.

Hereinafter, first and second embodiments of the present invention will be described. Note that, in the following description of the Drawings, the same or similar reference numerals denote the same or similar elements and portions. In addition, it should be noted that the Drawings are schematic and the relationship between thickness and planar dimensions, the ratios of dimensions, and the like are different from actual ones. Therefore, specific thicknesses and dimensions should be determined in consideration of the following description. Moreover, the Drawings also include portions having different dimensional relationships and ratios from each other.

In the following description of first and second embodiments, although a case in which a first conductivity type is a p-type and a second conductivity type is an n-type is described as an example, the conductivity type may be selected in a reverse relation such that the first conductivity type is an n-type and the second conductivity type is a p-type. When the first conductivity type is a p-type and the second conductivity type is an n-type, the carrier as a signal charge is naturally an electron. When the first conductivity type is an n-type and the second conductivity type is a p-type, the carriers as signal charges are naturally holes. A person skilled in the art may easily understand that when the second conductivity type is an n-type, the minority carriers of the second conductivity type are holes, and that when the second conductivity type is a p-type, the minority carrier of the second conductivity type is an electron.

Moreover, in the following description, the directions "left-right" and "up-down" are definitions used for the sake of convenience, and such definitions do not limit the technical ideas of the present invention. Thus, for example, when the orientation of the paper is rotated by 90 degrees, "left-right" and "up-down" shall be read mutually exchanged. When the paper is rotated by 180 degrees, naturally, "the left" is changed to "the right" and "the right" is changed to "the left".

First Embodiment

<Optical Detection Element According to First Embodiment>

Figure 2:
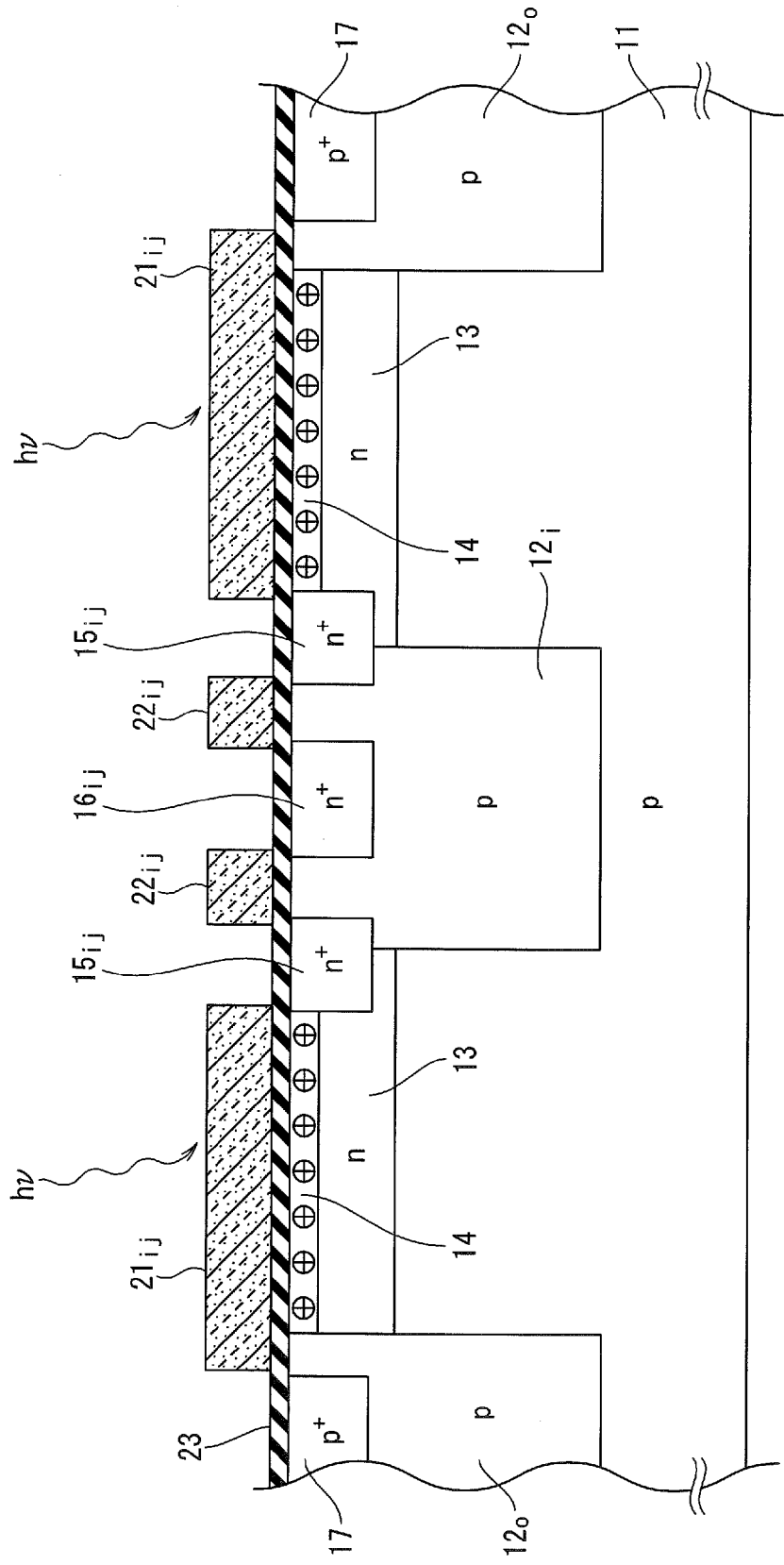
FIG. 2 is a cross-sectional view illustrating an exemplary cross-sectional structure of the optical detection element according to the first embodiment when seen from the direction II-II in FIG. 1.

As illustrated in FIGS. 1 and 2, an optical detection element according to a first embodiment of the present invention includes a base-body region 11 made of a semiconductor having a first conductivity type (p-type), a gate insulating film 23 contacted with an upper surface of the base-body region 11, a buried charge-generation region 13 of a second conductivity type (n-type) buried with an annular form (a ring form in the plan view of FIG. 1) in an upper portion of the base-body region 11 in contact with the gate insulating film 23, a charge-readout region $15_{i,j}$ of the second conductivity type having a higher impurity concentration than the buried charge-generation region 13, buried with an annular form in an upper portion of the base-body region 11 at a position close to an inner-contour side of the buried charge-generation region 13, a reset-drain region $16_{i,j}$ of the second conductivity type having a higher impurity concentration than the buried charge-generation region 13, buried on the inner-contour side of the charge-readout region $15_{i,j}$ in a state of being separated from the charge-readout region $15_{i,j}$, a transparent electrode $21_{i,j}$ provided in an annular form on the gate insulating film 23 above the buried charge-generation region 13, and a reset-gate electrode $22_{i,j}$ provided on the gate insulating film 23 above the base-body region 11 between the charge-readout region $15_{i,j}$ and the reset-drain region $16_{i,j}$. As illustrated in FIG. 2, the charge-readout region $15_{i,j}$ is in contact with the buried charge-generation region 13.

In the plan view of FIG. 1, although continuous belt-like shapes, in which both the outer-contour side shape and the inner-contour side shape of the transparent electrode $21_{i,j}$ have an octagonal shape, and furthermore, both the outer-contour side shape and the inner-contour side shape of the reset-gate electrode $22_{i,j}$ have the octagonal shape, are illustrated as examples of an annular topology, the annular topology is not limited to the shapes illustrated in FIG. 1. That is, when seen as a planar pattern, since a closed geometric shape in which a starting point and a terminating point of the continuous belt coincide with each other is an "annular form," the shape of the transparent electrode $21_{i,j}$ and the reset-gate electrode $22_{i,j}$ may be another continuous shape that the electrode is surrounded by an outer-contour line and an inner-contour line of a circle or another polygon having an approximately fixed width of the belt. However, in the case of a polygon, since non-uniformity of an electric field due to an interior angle portion of the polygon may occur, the interior angle of the polygon is preferably large. Thus, a hexagon is more preferable than a tetragon, an octagon is more preferable than the hexagon, and a circle is more preferable than the octagon. However, it is not necessary that the planar pattern is point-symmetric about the center of the reset-drain region $16_{i,j}$ as long as the planar pattern has a topology such that a closed continuous belt surrounds the reset-drain region $16_{i,j}$ with an approximately fixed belt width.

As illustrated in FIG. 1, in the optical detection element according to the first embodiment, the transparent electrode $21_{i,j}$ is delineated into an annular form on the outer side of the optical detection element, and the charge-readout region $15_{i,j}$ is arranged at the inner side of the pattern of the transparent electrode $21_{i,j}$. Actually, depending on a thermal process, as indicated by a broken line in the plan view of FIG. 1, impurity atoms of the second conductivity type that implement the charge-readout region $15_{i,j}$ are allowed to diffuse thermally in a lateral direction further than a boundary position of a pattern determined by a mask level so that a planar pattern in which the outer-contour line of the charge-readout region $15_{i,j}$ is positioned in a region slightly closer to the outer side than the inner-contour line of the transparent electrode $21_{i,j}$ is obtained. Similarly, in the plan view of FIG. 1, although the annular reset-gate electrode $22_{i,j}$ is disposed on the inner side of the charge-readout region $15_{i,j}$, as indicated by a broken line, impurity atoms of the second conductivity type that implement the charge-readout region $15_{i,j}$ are allowed to diffuse thermally in a lateral direction further than a boundary position of a pattern determined by a mask level so that a planar pattern in which the inner-contour line of the charge-readout region $15_{i,j}$ is positioned closer to the inner side than the outer-contour line of the reset-gate electrode $22_{i,j}$ is obtained. The corresponding cross-sectional view of FIG. 2 illustrates a state in which lateral ends of the charge-readout region $15_{i,j}$ slightly overlap an inner end of the transparent electrode $21_{i,j}$ and an outer end of the reset-gate electrode $22_{i,j}$. It is also possible non-overlap cases both just according and slightly separating between lateral ends of the charge-readout region $15_{i,j}$ and an inner end of the transparent electrode $21_{i,j}$ and between lateral ends of the charge-readout region $15_{i,j}$ and an outer end of the reset-gate electrode $22_{i,j}$. By providing the annular reset-gate electrode $22_{i,j}$ on the inner side of the charge-readout region $15_{i,j}$, it is possible to suppress a turn-off leakage current due to irradiation of radiant lay at a channel-sidewall oxide-film boundary, which is inevitable in a general transistor in which the gate shape is square.

In the plan view of FIG. 1, although the reset-drain region $16_{i,j}$ is disposed on the inner side of the reset-gate electrode $22_{i,j}$, as indicated by a broken line, impurity atoms of the second conductivity type that implement the reset-drain region $16_{i,j}$ are allowed to diffuse thermally in a lateral direction further than a boundary position of a pattern determined by a mask level so that a planar pattern in which the outer-contour line of the reset-drain region $16_{i,j}$ is positioned in a region slightly closer to the outer side than the inner-contour line of the reset-gate electrode $22_{i,j}$ is obtained. The corresponding cross-sectional view of FIG. 2 illustrates a state in which lateral ends of the reset-drain region $16_{i,j}$ overlap inner ends of the reset-gate electrode $22_{i,j}$.

As illustrated in FIG. 2, a well region $12_i$ of a first conductivity type having a higher impurity concentration than the base-body region 11 is buried in an upper portion of the base-body region 11 immediately below the reset-gate electrode $22_{i,j}$. Although the planar pattern is not illustrated, the well region $12_i$ is buried in an octagonal form so as to surround the reset-drain region $16_{i,j}$ and the outer-contour line of the well region $12_i$ on the planar pattern establishes an octagonal shape, being sandwiched between the outer-contour line and the inner-contour line of the charge-readout region $15_{i,j}$. It can be understood from the cross-sectional view of FIG. 2, the well region $12_i$ is buried to surround the entire side plane and the entire bottom plane of the reset-drain region $16_{i,j}$ and the side plane of the well region $12_i$ is in contact with the bottom plane of the charge-readout region $15_{i,j}$. The outer-contour line of the well region $12_i$ is preferably separated from the inner-contour line of the transparent electrode $21_{i,j}$.

In the optical detection element according to the first embodiment illustrated in FIG. 2, since the well region $12_i$ is implemented by a p-type semiconductor region, a reset transistor is implemented by an nMOS transistor that includes the reset-gate electrode $22_{i,j}$, the gate insulating film 23, the well region $12_i$, the charge-readout region $15_{i,j}$, and the reset-drain region $16_{i,j}$. Moreover, a voltage is applied to the reset-gate electrode $22_{i,j}$ to exhaust the charges accumulated in the charge-readout region $15_{i,j}$ to the reset-drain region $16_{i,j}$ to reset the charges accumulated in the charge-readout region $15_{i,j}$.

As illustrated on both end sides of the cross-sectional view of FIG. 2, an element isolation region $12_o$ of the first conductivity type having a higher impurity concentration than the base-body region 11 is arranged on the outer side of the transparent electrode $21_{i,j}$ so as to surround the buried charge-generation region 13. Furthermore, a channel-stop region 17 of the first conductivity type having a higher impurity concentration than the element isolation region $12_o$ is buried in the surface portion of the element isolation region $12_o$. As indicated by the broken line in the plan view of FIG. 1, depending on a thermal process, impurity atoms of the first conductivity type that implement the element isolation region $12_o$ may thermally diffuse in a lateral direction further than a boundary position of a pattern determined by a mask level so that a planar pattern in which the inner-contour line of the element isolation region $12_o$ is positioned in a region closer to the inner side than the outer-contour line of the transparent electrode $21_{i,j}$ is obtained.

Since the inner-contour line of the element isolation region $12_o$ is delineated as a planar pattern such that the inner-contour line is positioned closer to the inner side than the outer-contour line of the transparent electrode $21_{i,j}$ at an equal interval, the inner-contour line of the element isolation region $12_o$ is delineated as a closed geometric shape. On the other hand, the inner-contour line of the channel-stop region 17 surrounds the planar pattern of the transparent electrode $21_{i,j}$ and the inner-contour line of the channel-stop region 17 is also delineated as a closed geometric shape. Since the element isolation region $12_o$ is disposed on the outer side of the transparent electrode $21_{i,j}$, it is possible to suppress the generation of a dark current in the peripheral portion of the buried charge-generation region 13 provided immediately below the transparent electrode $21_{i,j}$.

Although the planar pattern is not illustrated, the topology of the buried charge-generation region 13 buried in the surface side portion of the base-body region 11 is a closed geometric shape. That is, the outer-contour line of the buried charge-generation region 13 is a line that is delineated as an octagonal shape that is common to the inner-contour line of the element isolation region $12_o$ in FIG. 1, and the inner-contour line of the buried charge-generation region 13 on the planar pattern of FIG. 1 is delineated as an octagonal shape that passes between the outer-contour line and the inner-contour line of the charge-readout region $15_{i,j}$. In this manner, the octagonal buried charge-generation region 13 is buried with an annular form in the surface side portion of the base-body region 11, and the annular and octagonal transparent electrode $21_{i,j}$ is laminated on the annular and octagonal buried charge-generation region 13 with the thin gate insulating film 23 interposed between the buried charge-generation region 13 and the transparent electrode $21_{i,j}$.

When the transparent electrode $21_{i,j}$ is formed using a polycrystalline silicon (hereinafter referred to as a "doped-polysilicon") doped with an impurity of the second conductivity type such as phosphor (P) or arsenic (As), it is convenient from the viewpoint of the manufacturing process because the boundary between the transparent electrode $21_{i,j}$ and the charge-readout region $15_{i,j}$ can be self-aligned. An oxide thin film (a transparent conductive oxide) such as tin oxide ($SnO_2$), indium (In)-doped tin oxide (ITO), aluminum (Al)-doped zinc oxides (AZO), gallium (Ga)-doped zinc oxide (GZO), or In-doped zinc oxide (IZO) may be used.

When a doped-polysilicon doped with an impurity of the second conductivity type is used for the reset-gate electrode $22_{i,j}$, it is preferable because the boundary between the reset-gate electrode $22_{i,j}$ and the charge-readout region $15_{i,j}$ and the boundary between the reset-gate electrode $22_{i,j}$ and the reset-drain region $16_{i,j}$ can be self-aligned.

Figure 3:
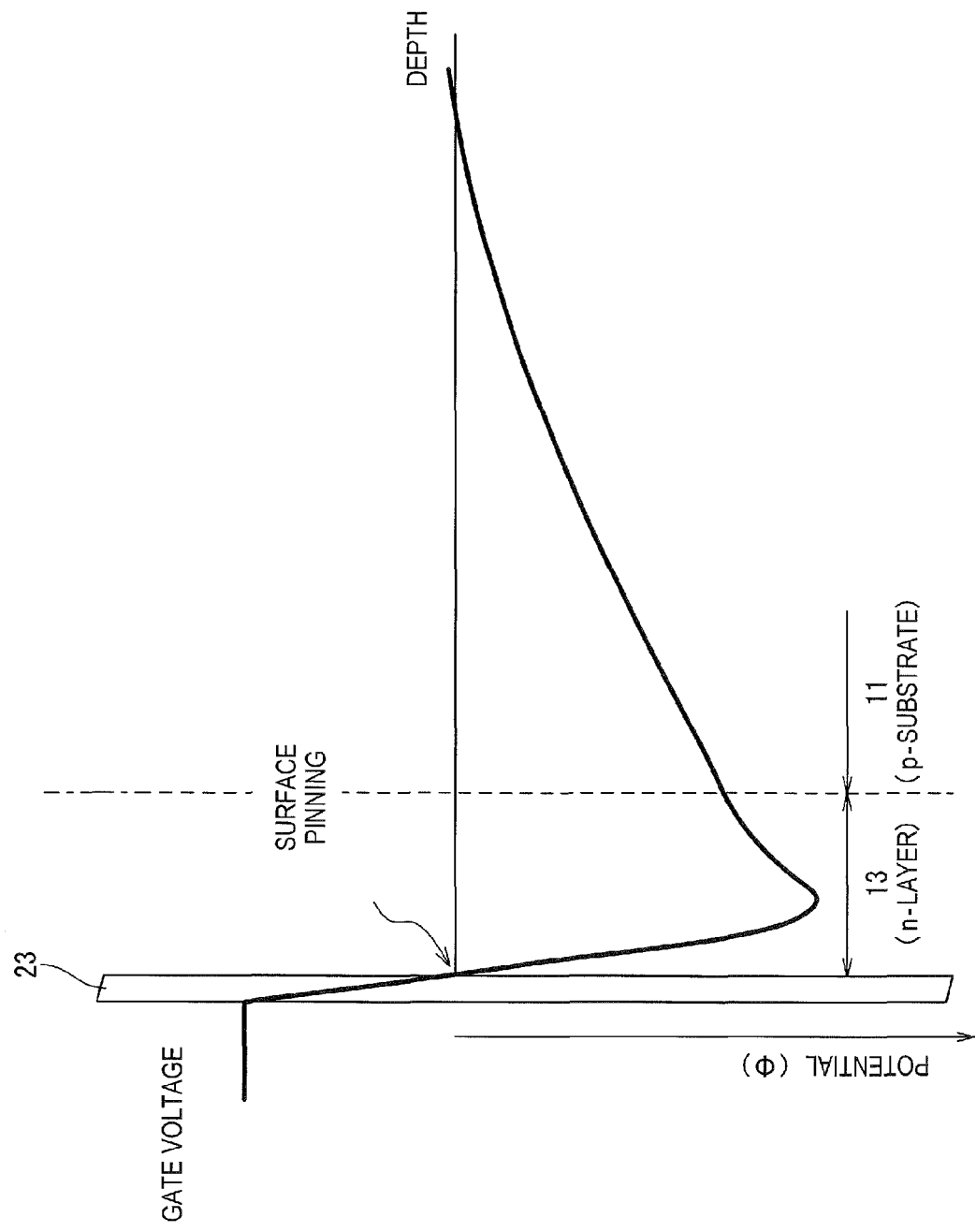
FIG. 3 is a potential profile for describing a state in which a surface potential is pinned by holes, when a potential at a transparent electrode of the optical detection element affects a surface of a buried charge-generation region via a gate insulating film, according to the first embodiment.

In the optical detection element according to the first embodiment, when a negative voltage is applied to the transparent electrode $21_{i,j}$, a potential profile illustrated in FIG. 3 is obtained. As illustrated in FIG. 3, when a potential at the transparent electrode $21_{i,j}$ affects the surface of the buried charge-generation region 13 via the gate insulating film 23, the surface potential of the buried charge-generation region 13 is pinned to the base-body potential by charges of the minority carriers in the buried charge-generation region 13.

For example, as illustrated in FIG. 3, when the buried charge-generation region 13 is an n-type, the minority carriers are holes. Then, an inversion layer 14 is induced by a large number of holes at the interface between the semiconductor and the gate insulating film 23 immediately below the transparent electrode $21_{i,j}$, or the inversion layer 14 is induced at the surface of the buried charge-generation region 13, and the surface potential is pinned to the base-body potential by holes of minority carriers. When the surface potential is pinned by the holes, the interface states at the interface between the semiconductor and the gate insulating film 23 are deactivated. Conversely, when the buried charge-generation region 13 is a p-type, since the minority carriers are electrons, an inversion layer 14 is induced by a large number of electrons at the interface between the semiconductor and the gate insulating film 23 immediately below the transparent electrode $21_{i,j}$, or the inversion layer 14 is induced at the surface of the buried charge-generation region 13, and the surface potential is pinned by the electrons. When the surface potential is pinned to the interface by electrons, the interface states at the interface between the semiconductor and the gate insulating film 23 is deactivated. Moreover, when gamma rays are irradiated to the optical detection element according to the first embodiment, although holes are generated in the thin gate insulating film 23, since the gate insulating film 23 is thin, an absolute quantity of the holes generated in the gate insulating film 23 is small.

Figure 4:
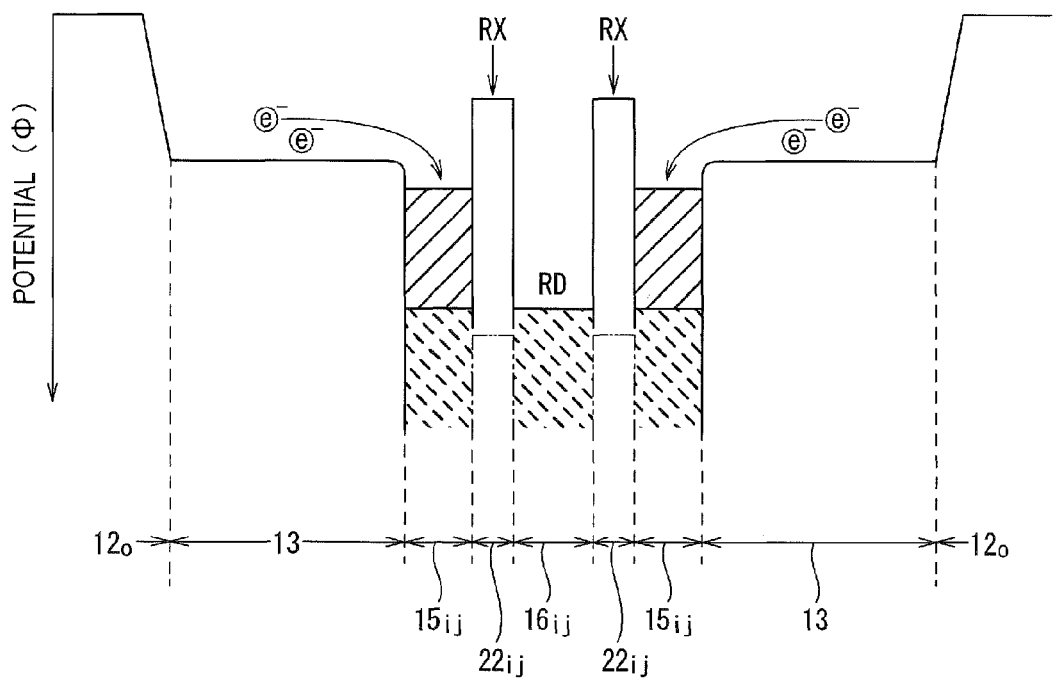
FIG. 4 is a diagram for describing a potential profile corresponding to a structure extending from an element isolation region to a reset-drain region at the center illustrated in the cross-sectional view of FIG. 2 via a buried charge-generation region, a charge-readout region, and a reset-gate electrode, and movement of signal charges in the potential profile (when a reset voltage VRD is high)

FIG. 4 is a diagram corresponding to the lateral positions illustrated in the cross-sectional view of FIG. 2 and is a diagram illustrating an example of a potential distribution having a center-symmetric profile extending from the element isolation region $12_o$ at the outer sides to the reset-drain region $16_{i,j}$ at the center, via the buried charge-generation region 13, the charge-readout region $15_{i,j}$, and the reset-gate electrode $22_{i,j}$. A potential level indicated by symbol RD at the bottom of a well at the center of FIG. 4,—or, the potential level at the upper end of an area indicated by hatched top-left diagonal broken line in FIG. 4—is a reset voltage VRD which is the voltage of the reset-drain region $16_{i,j}$.

In the optical detection element according to the first embodiment, as illustrated in FIG. 4, a depletion potential of a channel immediately below the transparent electrode $21_{i,j}$ is shallower than the potential of the charge-readout region $15_{i,j}$, and the charges photo-electrically converted in the channel portion immediately below the transparent electrode $21_{i,j}$ are always transferred to the charge-readout region $15_{i,j}$. That is, according to the profile of the potential distribution illustrated in FIG. 4, the signal charges (electrons) generated in the buried charge-generation region 13 immediately below the transparent electrode $21_{i,j}$ are always transferred from the buried charge-generation region 13 to the charge-readout region $15_{i,j}$ on the inner side as indicated by arrows directed toward the center of FIG. 4.

In FIG. 4, the transferred charges accumulated in the charge-readout region $15_{i,j}$ are depicted by hatched top-right diagonal solid lines. By establishing such a potential distribution profile as illustrated in FIG. 4, it is possible to decrease the capacitance of the charge-readout region $15_{i,j}$ of the optical detection element according to the first embodiment and to increase the conversion gain of signal charges.

Therefore, it is possible to increase the voltage-sensitivity of the optical detection element according to the first embodiment.

After the charges photo-electrically converted in the buried charge-generation region 13 immediately below the transparent electrode $21_{i,j}$ are accumulated in the charge-readout region $15_{i,j}$ for a predetermined period, the signal level of the charge-readout region $15_{i,j}$ may be read out, and subsequently, a reset level may be read out by a reset operation. In FIG. 4, although signal charges are accumulated in the charge-readout region $15_{i,j}$ only in order to increase the conversion gain, depending on the purpose of use, the conversion gain may be decreased so that a large amount of signal charge can be used.

In the optical detection element according to the first embodiment, of which the exemplary cross-sectional structure is illustrated in FIG. 2, a case in which a semiconductor substrate (Si substrate) of the first conductivity type (p-type) is used as the "base-body region 11" is illustrated as an example. However, an epitaxial growth layer of the first conductivity type having a lower impurity concentration than the semiconductor substrate may be formed on the semiconductor substrate of the first conductivity type and the epitaxial growth layer may be used as the base-body region 11 instead of the semiconductor substrate. Alternatively, an epitaxial growth layer of the first conductivity type (p-type) may be grown on the semiconductor substrate of the second conductivity type (n-type) and the epitaxial growth layer may be used as the base-body region 11. Alternatively, silicon on insulator (SOI) architecture may be used, such that a SOI semiconductor layer of the first conductivity type is used as the base-body region 11 so as to form the SOI structure.

The optical detection element according to the first embodiment is not limited to a simple MOS transistor in which a silicon oxide film is used as the gate insulating film 23. That is, the optical detection element according to the first embodiment may be implemented by MIS transistors, in which a single-layer film of at least one of a strontium oxide (SrO) film, a silicon nitride ($Si_3N_4$) film, an aluminum oxide ($Al_2O_3$) film, a magnesium oxide film (MgO) film, a yttrium oxide ($Y_2O_3$) film, a hafnium oxide ($HfO_2$) film, a zirconium oxide ($ZrO_2$) film, a tantalum oxide ($Ta_2O_5$) film, and a bismuth oxide ($Bi_2O_3$) film other than the silicon oxide film or a composite film obtained by stacking a plurality of these films is used as the gate insulating film 23. However, these gate insulating film materials need to have radiation tolerance.

Figure 5:
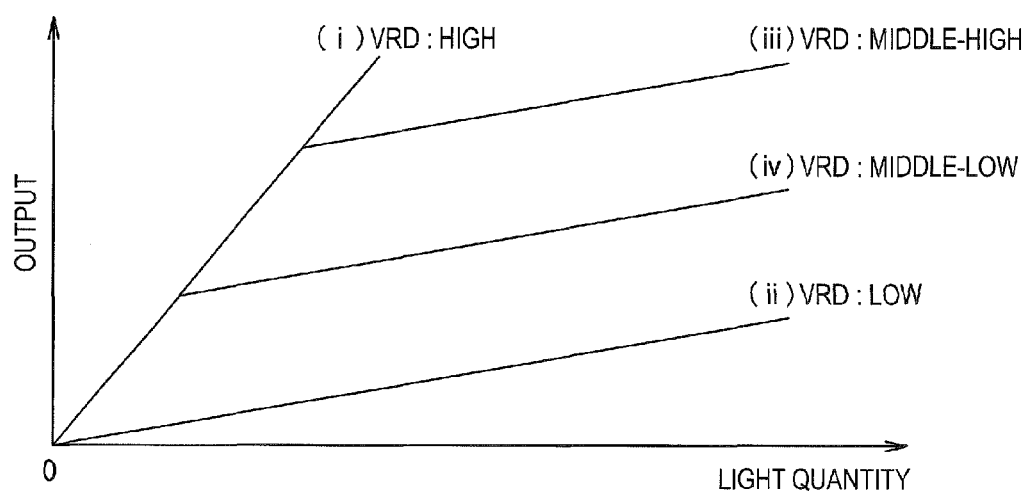
FIG. 5 is a diagram for describing how the sensitivity characteristics of the optical detection element according to the first embodiment can be changed by varying the reset voltage VRD.

As illustrated schematically in curves (i) to (iv) in FIG. 5, by varying the reset voltage VRD, which is the voltage of the reset-drain region $16_{i,j}$ of the optical detection element according to the first embodiment, from "HIGH" level to "MIDDLE-HIGH" level, "MIDDLE-LOW" level, and finally, to "LOW" level, or alternatively, by varying sequentially from "LOW" level to "MIDDLE-LOW" level, "MIDDLE-HIGH" level, and finally, to "HIGH" level, it is possible to change the output characteristics prescribed by the output intensity against to an incident light quantity, or the sensitivity=(output intensity)/(light quantity) can be changed in various ways.

A monotonously increasing straight line denoted by symbol (i) in FIG. 5 illustrates sensitivity characteristics corresponding to the reset voltage VRD="HIGH" illustrated in FIG. 4 and a high conversion gain is obtained in an entire output range.

Figure 6A:
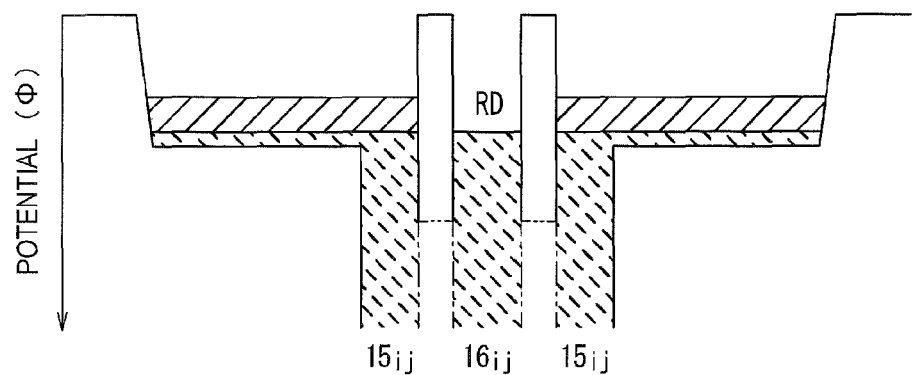
FIGS. 6A to 6C are diagrams illustrating the same potential profiles as that in FIG. 4 when the reset voltage VRD is low, middle-low, and middle-high, respectively, and are diagrams for describing movement of signal charges in the respective potential profiles.
Figure 6B:
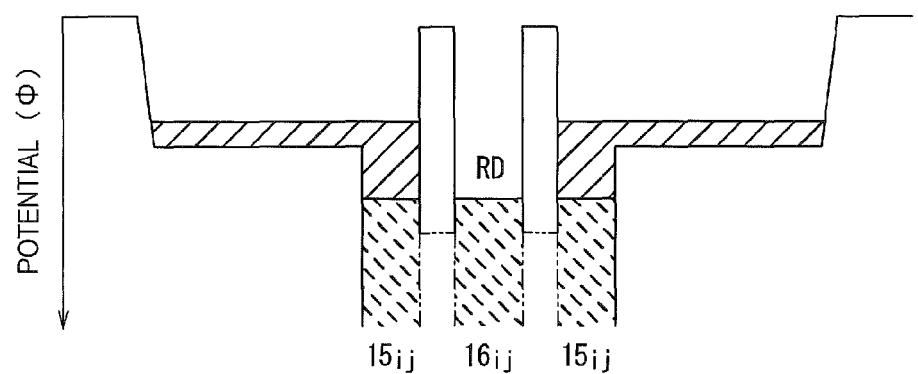
Figure 6C:
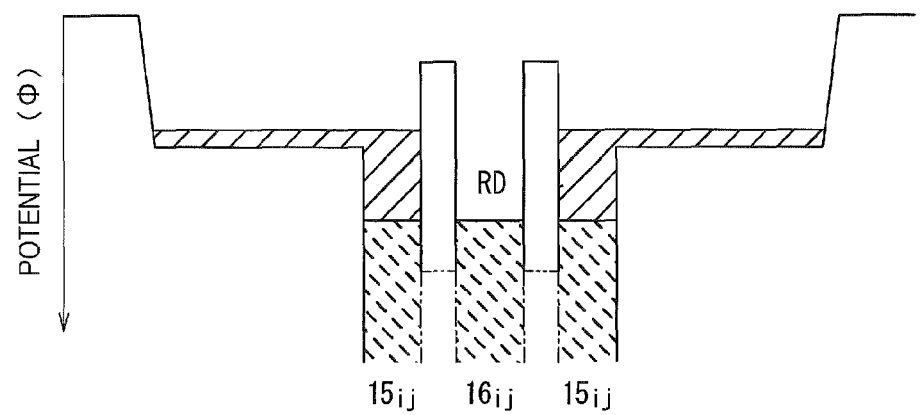

As indicated by an area hatched with top-left diagonal broken lines in FIG. 6C, when the reset voltage VRD="MIDDLE-HIGH," and the reset voltage VRD is higher than the channel potential of the transparent electrode $21_{i,j}$ and is lower than "HIGH" in FIG. 4, the behavior of the photo-electrically converted charges changes so as to be accumulated in the charge-readout region $15_{i,j}$ at its initial stage, and then, be accumulated under the transparent electrode $21_{i,j}$ at its intermediate stage as indicated by an area hatched with top-right diagonal solid lines in FIG. 6C. Therefore, when the reset voltage VRD="MIDDLE-HIGH," as illustrated in the curve (iii) in FIG. 5, the sensitivity of the optical detection element according to the first embodiment has such characteristics that the sensitivity is high at its initial stage, and changes along a monotonously increasing straight line like the curve (i), but bends and decreases in the halfway of the curve (i).

As illustrated in FIG. 6B, as indicated by an area hatched with top-left diagonal broken lines, when the reset voltage VRD="MIDDLE-LOW" and the reset voltage VRD is slightly higher than the channel potential of the transparent electrode $21_{i,j}$ but is lower than "MIDDLE-HIGH" illustrated in FIG. 6C, since the photo-electrically converted charges are first accumulated in the charge-readout region $15_{i,j}$ as indicated by an area hatched with top-right diagonal solid lines, the sensitivity is high and changes along the curve (i) at its initial stage. However, when the reset voltage VRD="MIDDLE-LOW," since the photo-electrically converted charges change so as to be accumulated under the transparent electrode $21_{i,j}$ at its intermediate stage, as illustrated in the curve (iv) in FIG. 5, the sensitivity of the optical detection element according to the first embodiment has such characteristics that the sensitivity bends and decreases in the halfway of the curve (i). When the reset voltage VRD="MIDDLE-LOW," the amount of charges accumulated in the charge-readout region $15_{i,j}$ is smaller than the case of "MIDDLE-HIGH" illustrated in FIG. 6C whereas the amount of charges accumulated under the transparent electrode $21_{i,j}$ is relatively larger than the case of "MIDDLE-HIGH". Therefore, the sensitivity curve bends at a position at which the light quantity is smaller than the case of "MIDDLE-HIGH".

Furthermore, as illustrated in FIG. 6A, as indicated by an area hatched with top-left diagonal broken lines, when the reset voltage VRD="LOW" and the reset voltage VRD is lower than the channel potential of the transparent electrode $21_{i,j}$, all the photo-electrically converted charges are accumulated under the transparent electrode $21_{i,j}$ as indicated by the an area hatched with top-right diagonal solid lines. Therefore, when the reset voltage VRD="LOW," although the sensitivity of the optical detection element according to the first embodiment is low, a large amount of signal charges can be used as illustrated in the curve (ii) in FIG. 5.

The bending points illustrated in the curves (iii) and (iv) in FIG. 5 can be adjusted by the reset voltage VRD. In the optical detection element according to the first embodiment, it is preferable that the reset gate voltage applied to the reset-gate electrode $22_{i,j}$ of the optical detection element according to the first embodiment shall be changed toward both the high and low sides, following the variation of the reset voltage VRD, which is the voltage of the reset-drain region $16_{i,j}$, from "HIGH" to "MIDDLE-HIGH," "MIDDLE-LOW," and finally, to "LOW".

<Solid-State Image Pickup Device According to First Embodiment>

Figure 7:
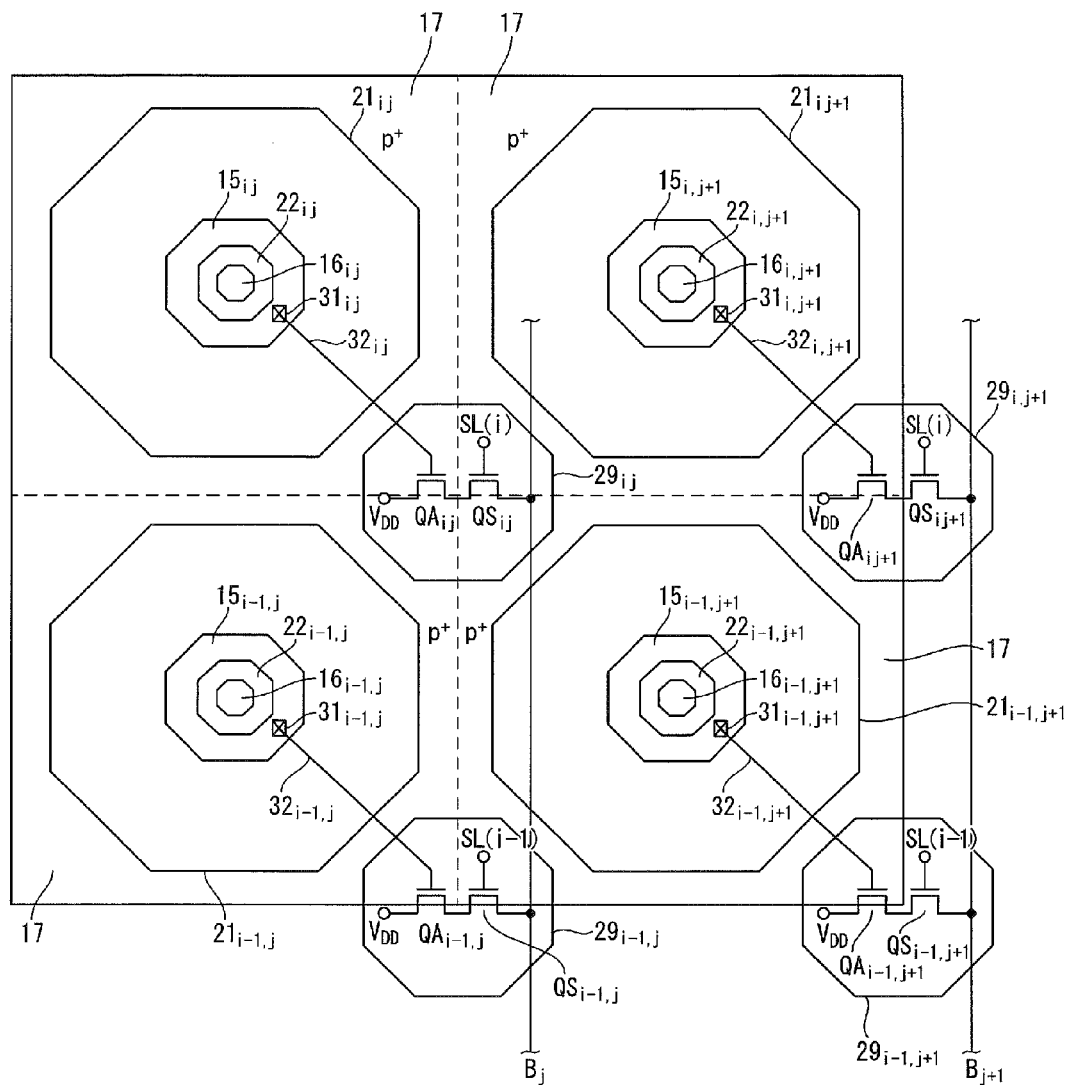
FIG. 7 is a schematic plan view illustrating a schematic structure of a main part of a 2×2 matrix that implements a portion of a pixel array area of a solid-state image pickup device (a CMOS image sensor) according to the first embodiment of the present invention.

When a plurality of unit pixels are arranged in a two-dimensional matrix form, using the optical detection elements having the structure illustrated in FIGS. 1 and 2 as unit pixels, it is possible to implement a pixel array area of a solid-state image pickup device (two-dimensional image sensor) according to the first embodiment of the present invention. For the sake of convenience, FIG. 7 schematically illustrates the solid-state image pickup device according to the first embodiment using a planar structure in which four unit pixels among the plurality of unit pixels, which implement the pixel array area, are two-dimensionally arranged in a 2×2 matrix form. That is, the solid-state image pickup device according to the first embodiment illustrated in FIG. 7 illustrates an example of a planar pattern in a partial area of a pixel array area, in which a 2×2 matrix structure is implemented by a (i,j)th pixel at the top-left corner, a (i,j+1)th pixel at the top-right corner, a (i−1,j)th pixel at the bottom-left corner, and a (i−1,j+1)th pixel at the bottom-right corner.

A pixel array area can establish a square imaging region, for example. A peripheral circuit portion is disposed at the periphery of the pixel array area, and the pixel array area and the peripheral circuit portion are integrated on the same semiconductor chip. A horizontal shift register, a vertical shift register, a timing generation circuit, and other circuits are included in the peripheral circuit portion.

More specifically, for example, a layout design in which the horizontal shift register is provided in a lower side portion of a square pixel array area along the direction of pixel rows illustrated in a horizontal direction in FIG. 7 can be achieved. In this case, for example, the vertical shift register is provided in a left side portion of the pixel array area along the direction of pixel columns illustrated in a vertical direction in FIG. 7, and the timing generation circuit may be connected to the vertical shift register and the horizontal shift register.

Although two vertical signal lines only are illustrated in FIG. 7, vertical signal lines $B_j$, $B_{j+1}$, . . . , and the like are provided in respective pixel columns. Moreover, a MOS transistor serving as a constant current load is connected to one set of ends on the upper or lower side of the vertical signal lines $B_j$, $B_{j+1}$, . . . , and the like in the arrangement of FIG. 7 to implement a source follower circuit in combination with a MOS transistor $QA_{i,j}$ and the like in the pixel to transmit a pixel signal to the vertical signal line $B_j$ and the like. Moreover, a column processing circuit is connected to one set of ends on the same or opposite side as the constant current load, of the vertical signal lines $B_j$, $B_{j+1}$, . . . , and the like. A noise cancelling circuit and an A/D conversion circuit are included in each column processing circuit. The noise cancelling circuit may be implemented by correlated double sampling (CDS) or the like.

The cross-sectional structure of the (i,j)th pixel that implements the solid-state image pickup device according to the first embodiment illustrated at the top-left corner of FIG. 7 is the same as the cross-sectional structure of the optical detection element illustrated in FIG. 2 since the optical detection element illustrated in FIG. 2 is used as the unit pixel. Therefore, although the base-body region 11, the gate insulating film 23, the buried charge-generation region 13, and the like illustrated in FIG. 2 are not depicted in the plan view of FIG. 7, the cross-sectional structure of the (i,j)th pixel is basically completely the same as the cross-sectional structure illustrated in FIG. 2.

That is, the (i,j)th pixel that implements the solid-state image pickup device according to the first embodiment illustrated at the top-left corner of FIG. 7 includes a base-body region (not illustrated) made of a semiconductor of the first conductivity type, a gate insulating film (not illustrated) contacted with an upper surface of the base-body region, a buried charge-generation region (not illustrated) of the second conductivity type buried with an annular form in an upper portion of the base-body region, being contacted with the gate insulating film, the charge-readout region $15_{i,j}$ of the second conductivity type having a high impurity concentration than the buried charge-generation region, buried with an annular form in an upper portion of the base-body region at a position close to an inner-contour side of the buried charge-generation region, the reset-drain region $16_{i,j}$ having a higher impurity concentration than the buried charge-generation region, buried on the inner-contour side of the charge-readout region $15_{i,j}$ in a state of being separated from the charge-readout region $15_{i,j}$, the transparent electrode $21_{i,j}$ provided in an annular form on the gate insulating film above the buried charge-generation region 13, and the reset-gate electrode $22_{i,j}$ provided on the gate insulating film above the base-body region between the charge-readout region $15_{i,j}$ and the reset-drain region $16_{i,j}$. Although not illustrated in FIG. 7, similarly to the cross-sectional structure illustrated in FIG. 2, the charge-readout region $15_{i,j}$ is in contact with the buried charge-generation region 13, and the well region 12i of the first conductivity type having a higher impurity concentration than the base-body region is disposed in an upper portion of the base-body region immediately below the reset-gate electrode $22_{i,j}$. Similarly to the cross-sectional structure illustrated in FIG. 2, the element isolation region of the first conductivity type having a higher impurity concentration than the base-body region is disposed on the outer side of the transparent electrode $21_{i,j}$ so as to surround the buried charge-generation region 13. Furthermore, the channel-stop region 17 of the first conductivity type having a higher impurity concentration than the element isolation region is disposed on the surface of the element isolation region.

Similarly, as illustrated in at the top-right corner of FIG. 7, the (i,j+1)th pixel in the two-dimensional matrix includes a base-body region of the first conductivity type, a gate insulating film contacted with the upper surface of the base-body region, a buried charge-generation region of the second conductivity type buried with an annular form in an upper portion of the base-body region, being contacted with the gate insulating film, a charge-readout region $15_{i,j+1}$ of the second conductivity type having a higher impurity concentration than the buried charge-generation region, buried on the inner-contour side of the buried charge-generation region, a reset-drain region $16_{i,j+1}$ having a higher impurity concentration than the buried charge-generation region, buried on the inner-contour side of the charge-readout region $15_{i,j+1}$ in a state of being separated from the charge-readout region $15_{i,j+1}$, a transparent electrode $21_{i,j+1}$ provided in an annular form on the gate insulating film above the buried charge-generation region 13, and a reset-gate electrode $22_{i,j+1}$ provided above between the charge-readout region $15_{i,j+1}$ and the reset-drain region $16_{i,j+1}$. Similarly to the structure of FIG. 2, the charge-readout region $15_{i,j+1}$ is in contact with the buried charge-generation region 13, the well region 12i of the first conductivity type having a higher impurity concentration than the base-body region is disposed below the reset-gate electrode $22_{i,j+1}$, and an element isolation region of the first conductivity type having a higher impurity concentration than the base-body region is disposed on the outer side of the transparent electrode $21_{i,j+1}$ as an area continuous from the area of another pixel such as the (i,j)th pixel so as to surround the buried charge-generation region 13. Moreover, the channel-stop region 17 of the first conductivity type having a higher impurity concentration than the element isolation region is disposed on the surface of the element isolation region as an area continuous from the area of another pixel such as the (i,j)th pixel.

Moreover, as illustrated at the bottom-left corner of FIG. 7, the (i−1,j)th pixel in the two-dimensional matrix includes a base-body region of the first conductivity type, a gate insulating film contacted with the upper surface of the base-body region, a buried charge-generation region of the second conductivity type buried in an upper portion of the base-body region, being contacted with the gate insulating film, a charge-readout region $15_{i-1,j}$ of the second conductivity type having a higher impurity concentration than the buried charge-generation region 13, buried on the inner-contour side of the buried charge-generation region, a reset-drain region $16_{i-1,j}$ having a higher impurity concentration than the buried charge-generation region, buried on the inner-contour side of the charge-readout region $15_{i-1,j}$, a transparent electrode $21_{i-1,j}$ provided above the buried charge-generation region 13, and a reset-gate electrode $22_{i-1,j}$ provided above between the charge-readout region $15_{i-1,j}$ and the reset-drain region $16_{i-1,j}$. Similarly to the structure of FIG. 2, the charge-readout region $15_{i-1,j}$ is in contact with the buried charge-generation region, the well region $12_{i-1}$ of the first conductivity type having a higher impurity concentration than the base-body region is disposed below the reset-gate electrode $22_{i-1,j}$, and an element isolation region of the first conductivity type having a higher impurity concentration than the base-body region is disposed on the outer side of the transparent electrode $21_{i-1,j}$, as an area continuous from the area of another pixel such as the (i,j)th pixel so as to surround the buried charge-generation region 13. Moreover, the channel-stop region 17 of the first conductivity type having a higher impurity concentration than the element isolation region is disposed on the surface of the element isolation region as an area continuous from the area of another pixel such as the (i,j)th pixel.

Moreover, as illustrated at the bottom-right corner of FIG. 7, the (i−1,j+1)th pixel in the two-dimensional matrix includes a base-body region of the first conductivity type, a gate insulating film contacted with the upper surface of the base-body region, a buried charge-generation region 13 of the second conductivity type buried in an upper portion of the base-body region, being contacted with the gate insulating film, a charge-readout region $15_{i-1,j+1}$ of the second conductivity type having a higher impurity concentration than the buried charge-generation region 13, buried on the inner-contour side of the buried charge-generation region 13, a reset-drain region $16_{i-1,j+1}$ having a higher impurity concentration than the buried charge-generation region 13, buried on the inner-contour side of the charge-readout region $15_{i-1,j+1}$, a transparent electrode $21_{i-1,j+1}$ provided above the buried charge-generation region 13, and a reset-gate electrode $22_{i-1,j+1}$ provided above between the charge-readout region $15_{i-1,j+1}$ and the reset-drain region $16_{i-1,j+1}$. Similarly to the structure of FIG. 2, the charge-readout region $15_{i-1,j+1}$ is in contact with the buried charge-generation region 13, the well region $12_{i-1}$ of the first conductivity type having a higher impurity concentration than the base-body region is disposed below the reset-gate electrode $22_{i-1,j+1}$, and an element isolation region of the first conductivity type having a higher impurity concentration than the base-body region is disposed on the outer side of the transparent electrode $21_{i-1,j+1}$ has an area continuous from the area of another pixel such as the (i−1,j)th pixel and (i,j+1)th pixel so as to surround the buried charge-generation region 13. Moreover, the channel-stop region 17 of the first conductivity type having a higher impurity concentration than the element isolation region is disposed on the surface of the element isolation region as an area continuous from the area of another pixel such as the (i−1,j)th pixel and (i,j+1)th pixel.

As illustrated in FIG. 7, one end of a surface interconnection $32_{i,j}$ extending in a bottom-right direction is connected to the charge-readout region $15_{i,j}$ of the (i,j)th pixel in the two-dimensional matrix via a contact hole $31_{i,j}$, and a gate electrode of an amplification transistor (signal readout transistor) $QA_{i,j}$ of a readout-circuit portion $29_{i,j}$ is connected to the other end of the surface interconnection $32_{i,j}$. That is, in the circuit structure illustrated in FIG. 7, since the charge-readout region $15_{i,j}$ functions as a source region of a reset transistor, the gate electrode of the amplification transistor $QA_{i,j}$ and a source region of the reset transistor $TR_{i,j}$ are connected to the charge-readout region $15_{i,j}$. The surface interconnection $32_{i,j}$ illustrated in FIG. 7 is an exemplary representation on a schematic equivalent circuit, and actually, does not need to be such a wiring extending in the bottom-right direction as illustrated in FIG. 7. For example, the surface interconnection may be implemented by orthogonal surface interconnections (metal wirings) architecture, of which the wiring levels are different using a multilevel wiring structure. That is, the surface interconnection may be implemented by a structure in which the upper and lower orthogonal surface interconnections are coupled by a contact plug or the like that passes through an interlayer insulating film interposed between the surface interconnections. That is, the surface interconnection $32_{i,j}$ having an arbitrary topology can be employed depending on the demand of a layout design on a semiconductor chip. A drain region of a pixel-selection transistor (switching transistor) $TS_{i,j}$ is connected to the source region of the amplification transistor $QA_{i,j}$ and a power supply wiring $V_{DD}$ is connected to the drain region of the amplification transistor $QA_{i,j}$. The vertical signal line $B_j$ arranged along the j-th column is connected to the source region of the pixel-selection transistor $TS_{i,j}$ and a select signal SL(i) of the i-th row is fed from the vertical shift register to the gate electrode of the pixel-selection transistor $TS_{i,j}$. By the voltage corresponding to the amount of charges transferred to the charge-readout region $15_{i,j}$, the output signal amplified by the amplification transistor $QA_{i,j}$ is fed to the vertical signal line $B_j$ via the pixel-selection transistor $TS_{i,j}$.

In FIG. 7, the octagonal outer-contour line indicating the readout-circuit portion $29_{i,j}$ indicates an outer boundary of a field-insulating film area for implementing the amplification transistor $QA_{i,j}$ and the pixel-selection transistor $TS_{i,j}$. A thick oxide film corresponding to the field-insulating film is provided between an active area of the amplification transistor $QA_{i,j}$ and an active area of the pixel-selection transistor $TS_{i,j}$ in the readout-circuit portion $29_{i,j}$. A thick oxide film is not present between the surface of the base-body region in which the pattern of the transparent electrode $21_{i,j}$ is disposed and the surface of the base-body region in which the pattern of the readout-circuit portion $29_{i,j}$ is disposed, and the element isolation region $12_o$ and the channel-stop region 17 as illustrated in the cross-sectional view of FIG. 2 are buried in the surface portion of the base-body region as an area continuous from the area of another pixel in the two-dimensional matrix.

Figure 8:
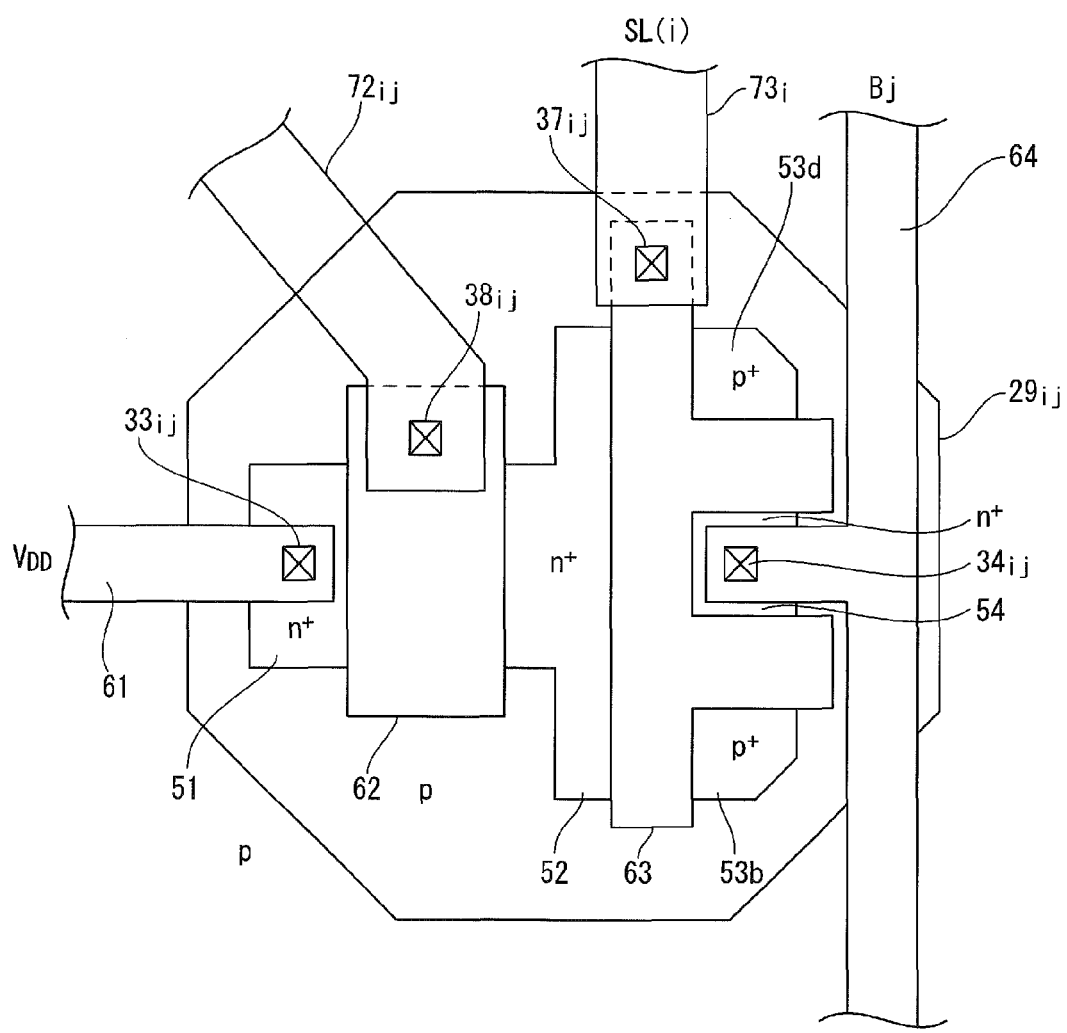
FIG. 8 is a plan view schematically illustrating an example of a planar pattern for implementing an amplification transistor and a pixel-selection transistor arranged in a pixel, which is used in the solid-state image pickup device according to the first embodiment.

The amplification transistor $QA_{i,j}$ and the pixel-selection transistor $TS_{i,j}$ illustrated in FIG. 7 may have a gate structure having a ring form or such a π-type as illustrated in FIG. 8 in order to achieve radiation tolerance. A basic concept of the π-type gate structure illustrated in FIG. 8 is disclosed in JP 2011-134784 A. That is, FIG. 8 illustrates an example of a planar pattern for implementing the amplification transistor $QA_{i,j}$ and the pixel-selection transistor $TS_{i,j}$ of the readout-circuit portion $29_{i,j}$, a main control unit of a π-type gate electrode 63 extends in an up-down direction (vertical direction) so as to stretch an inner active area in the area of the readout-circuit portion $29_{i,j}$.

Although the gate electrode 63 corresponds to the gate electrode of the pixel-selection transistor $TS_{i,j}$ illustrated in FIG. 7, as disclosed in JP 2011-134784 A, the gate electrode 63 has two guard portions that extend in a horizontal direction so as to surround a source region 54 of the pixel-selection transistor $TS_{i,j}$ to establish a π-shape. A common source/drain region 52 that serves as both the source region of the amplification transistor $QA_{i,j}$ and the drain region of the pixel-selection transistor $TS_{i,j}$ is disposed at the center of the readout-circuit portion $29_{i,j}$ in FIG. 8 as a semiconductor region of the second conductivity type. On the planar pattern of FIG. 8, the gate electrode 63 having the π-shape has a vertical main control unit that is orthogonal to a flow path of carriers flowing through the channel region between the common source/drain region 52 and the source region 54 and two horizontal guard portions that cross the vertical main control unit and surrounds three sides of the source region 54.

An element-isolation insulating-film surrounds the channel region of the pixel-selection transistor $TS_{i,j}$ inside the outer-contour line of the octagon that defines the area of the readout-circuit portion $29_{i,j}$ to define an active area in the upper portion of the base-body region. The common source/drain region 52 that injects carriers (electrons) to the channel region through a carrier injection opening is provided on one side (left side) of the active area, and the source region 54 of the second conductivity type having a carrier-exhausting opening through which carriers are exhausted from the channel region is provided on the other side (right side) of the active area. The source region 54 is implemented by the rectangular source region 54 of which only one side is in contact with the other end of the element-isolation insulating-film in order to achieve radiation tolerance.

The gate electrode 63 having the π-shape is provided on the gate insulating film laminated on the surface of the active area to electrostatically control the flow of carriers. Furthermore, leakage-protection regions 53b and 53d of the first conductivity type having a higher impurity concentration than the base-body region are provided in the active area on both end sides in the gate width direction (the up-down direction in FIG. 8) of the source region 54 on the planar pattern with two guard portions interposed between the source region 54 and the leakage-protection regions 53b and 53d. The leakage-protection regions 53b and 53d are arranged symmetrically in the up-down direction with two guard portions interposed between the source region 54 and the leakage-protection regions 53b and 53d. As illustrated in FIG. 8, the leakage-protection region 53b on the lower side is delineated so that the upper side of the leakage-protection region 53b is in contact with the guard portion on the lower side, the left side of the leakage-protection region 53b is in contact with the main control unit, and the remaining sides of the leakage-protection region 53b are in contact with the element-isolation insulating-film. On the other hand, as illustrated in FIG. 8, the leakage-protection region 53d on the upper side is delineated so that the lower side of the leakage-protection region 53d is in contact with the guard portion on the upper side, the left side of the leakage-protection region 53d is in contact with the main control unit, and the remaining sides of the leakage-protection region 53d are in contact with the element-isolation insulating-film.

A drain region 51 of the second conductivity type is allocated on the left side of the readout-circuit portion $29_{i,j}$ in FIG. 8, and a gate electrode 62 extends in a vertical direction between the drain region 51 and the common source/drain region 52. The gate electrode 62 is electrically connected to the charge-readout region $15_{i,j}$ of the (i,j)th pixel. The gate electrode 62 corresponds to the amplification transistor $QA_{i,j}$ schematically illustrated in FIG. 7 in a representation of equivalent circuit, and the gate electrode 62 is connected to the surface interconnection $32_{i,j}$ which is illustrated in the equivalent circuit of FIG. 7. The surface interconnection $32_{i,j}$ may actually be implemented by a multilevel wiring structure using a surface interconnection $72_{i,j}$ or the like connected via such a contact hole $38_{i,j}$ as illustrated in FIG. 8.

The contact hole $38_{i,j}$ is an opening that passes through an interlayer insulating film provided between the surface interconnection $72_{i,j}$ and the gate electrode 62. The drain region 51, the common source/drain region 52, and the gate electrode 62 implement the amplification transistor $QA_{i,j}$. The drain region 51 of the amplification transistor $QA_{i,j}$ is connected to the surface interconnection 61 that implements the power supply wiring via the contact hole $33_{i,j}$. On the other hand, the source region 54 of the pixel-selection transistor $TS_{i,j}$ is connected to the surface interconnection 64 that implements the vertical signal line $B_j$ via the contact hole $34_{i,j}$. The gate electrode 63 having the π-shape is connected to a surface interconnection $73i$ that implements the select signal supply wiring SL(i) via such a contact hole $37_{i,j}$ as illustrated in FIG. 8, for example. The contact hole $37_{i,j}$ is an opening that passes through the interlayer insulating film between the surface interconnection $72_i$ and the gate electrode 63. With the structure of which the plan view is illustrated in FIG. 8, even when a threshold voltage changes at the boundary between a field oxide film and a channel under the π-type gate electrode 63 due to irradiation of radiant lay, the turn-off leakage current is blocked by the leakage-protection regions 53b and 53d.

Similarly, one end of a surface interconnection $32_{i,j+1}$ extending in a bottom-right direction is connected to the charge-readout region $15_{i,j+1}$ of the (i,j+1)th pixel in the two-dimensional matrix via a contact hole $31_{i,j+1}$, and a gate electrode of an amplification transistor $QA_{i,j+1}$ of a readout-circuit portion $29_{i,j+1}$ is connected to the other end of the surface interconnection $32_{i,j+1}$. That is, in the circuit structure illustrated in FIG. 7, since the charge-readout region $15_{i,j+1}$ functions as a source region of a reset transistor, the gate electrode of the amplification transistor $QA_{i,j+1}$ and a source region of the reset transistor $TR_{i,j+1}$ are connected to the charge-readout region $15_{i,j+1}$. A drain region of a pixel-selection transistor $TS_{i,j+1}$ is connected to the source region of the amplification transistor $QA_{i,j+1}$ and a power supply wiring $V_{DD}$ is connected to the drain region of the amplification transistor $QA_{i,j+1}$. The vertical signal line $B_{j+1}$ arranged along the (j+1)th column is connected to the source region of the pixel-selection transistor $TS_{i,j+1}$ and a select signal SL(i) of the i-th row is fed from the vertical shift register to the gate electrode of the pixel-selection transistor $TS_{i,j+1}$. By the voltage corresponding to the amount of charges transferred to the charge-readout region $15_{i,j+1}$, the output signal amplified by the amplification transistor $QA_{i,j+1}$ is transmitted to the vertical signal line $B_{j+1}$ via the pixel-selection transistor $TS_{i,j+1}$.

In FIG. 7, the octagonal outer-contour line indicating the readout-circuit portion $29_{i,j+1}$ indicates an outer boundary of a field-insulating film area for arranging the amplification transistor $QA_{i,j+1}$ and the pixel-selection transistor $TS_{i,j+1}$. A thick oxide film corresponding to the field-insulating film is provided between an active area of the amplification transistor $QA_{i,j+1}$ and an active area of the pixel-selection transistor $TS_{i,j+1}$ in the readout-circuit portion $29_{i,j+1}$. A thick oxide film is not present between the surface of the base-body region in which the pattern of the transparent electrode $21_{i,j+1}$ is disposed and the surface of the base-body region in which the pattern of the readout-circuit portion $29_{i,j+1}$ is disposed, and the element isolation region $12_o$ and the channel-stop region 17 as illustrated in the cross-sectional view of FIG. 2 are disposed on the surface of the base-body region as an area continuous from the area of another pixel such as the (i,j)th pixel.

Similarly, one end of a surface interconnection $32_{i-1,j}$ extending in a bottom-right direction is connected to the charge-readout region $15_{i-1,j}$ of the (i–1,j)th pixel via a contact hole $31_{i-1,j}$, and a gate electrode of an amplification transistor $QA_{i-1,j}$ of a readout-circuit portion $29_{i-1,j}$ is connected to the other end of the surface interconnection $32_{i-1,j}$. That is, in the circuit structure illustrated in FIG. 7, since the charge-readout region $15_{i-1,j}$ functions as a source region of a reset transistor, the gate electrode of the amplification transistor $QA_{i-1,j}$ and a source region of the reset transistor $TR_{i-1,j}$ are connected to the charge-readout region $15_{i-1,j}$. A drain region of a pixel-selection transistor $TS_{i-1,j}$ is connected to the source region of the amplification transistor $QA_{i-1,j}$ and a power supply wiring $V_{DD}$ is connected to the drain region of the amplification transistor $QA_{i-1,j}$. The vertical signal line $B_j$ is connected to the source region of the pixel-selection transistor $TS_{i-1,j}$ and a select signal SL(i–1) of the (i–1)th row is fed from the vertical shift register to the gate electrode of the pixel-selection transistor $TS_{i-1,j}$. By the voltage corresponding to the amount of charges transferred to the charge-readout region $15_{i-1,j}$, the output signal amplified by the amplification transistor $QA_{i-1,j}$ is transmitted to the vertical signal line $B_j$ via the pixel-selection transistor $TS_{i-1,j}$.

In the plan view illustrated in FIG. 7, the outer-contour line of the octagon indicating the position (boundary) of the periphery of the readout-circuit portion $29_{i-1,j}$ indicates an area in which a field-insulating film area that defines the active area in which the amplification transistor $QA_{i-1,j}$ and the pixel-selection transistor $TS_{i-1,j}$ are formed is provided. That is, the active area of the amplification transistor $QA_{i-1,j}$ and the pixel-selection transistor $TS_{i-1,j}$ that implement the readout-circuit portion $29_{i-1,j}$ is defined by being surrounded by a thick oxide film corresponding to the field-insulating film on the planar pattern. A thick oxide film is not present between the surface of the base-body region in which the pattern of the transparent electrode $21_{i-1,j}$ is disposed and the surface of the base-body region in which the pattern of the readout-circuit portion $29_{i-1,j}$ is disposed, and the element isolation region $12_o$ and the channel-stop region 17 as illustrated in the cross-sectional view of FIG. 2 are buried in the surface portion of the base-body region as an area continuous from the area of another pixel such as the (i,j)th pixel.

Similarly, one end of a surface interconnection $32_{i-1,j+1}$ extending in a bottom-right direction is connected to the charge-readout region $15_{i-1,j+1}$ of the (i–1,j+1)th pixel via a contact hole $31_{i-1,j+1}$, and a gate electrode of an amplification transistor $QA_{i-1,j+1}$ of a readout-circuit portion $29_{i-1,j+1}$ is connected to the other end of the surface interconnection $32_{i-1,j+1}$. That is, in the circuit structure illustrated in FIG. 7, since the charge-readout region $15_{i-1,j+1}$ functions as a source region of a reset transistor, the gate electrode of the amplification transistor $QA_{i-1,j+1}$ and a source region of the reset transistor $TR_{i-1,j+1}$ are connected to the charge-readout region $15_{i-1,j+1}$. A drain region of a pixel-selection transistor $TS_{i-1,j+1}$ is connected to the source region of the amplification transistor $QA_{i-1,j+1}$ and a power supply wiring $V_{DD}$ is connected to the drain region of the amplification transistor $QA_{i-1,j+1}$. The vertical signal line $B_{j+1}$ is connected to the source region of the pixel-selection transistor $TS_{i-1,j+1}$ and a select signal SL(i–1) of the (i–1)th row is fed from the vertical shift register to the gate electrode of the pixel-selection transistor $TS_{i-1,j+1}$. By the voltage corresponding to the amount of charges transferred to the charge-readout region $15_{i-1,j+1}$, the output signal amplified by the amplification transistor $QA_{i-1,j+1}$ is transmitted to the vertical signal line $B_{j+1}$ via the pixel-selection transistor $TS_{i-1,j+1}$.

In FIG. 7, the octagonal outer-contour line indicating the readout-circuit portion $29_{i-1,j+1}$ indicates an outer boundary of a field-insulating film area for arranging the amplification transistor $QA_{i-1,j+1}$ and the pixel-selection transistor $TS_{i-1,j+1}$. A thick oxide film corresponding to the field-insulating film is provided between an active area of the amplification transistor $QA_{i-1,j+1}$ and an active area of the pixel-selection transistor $TS_{i-1,j+1}$ in the readout-circuit portion $29_{i-1,j+1}$. A thick oxide film is not present between the surface of the base-body region in which the pattern of the transparent electrode $21_{i-1,j+1}$ is delineated and the surface of the base-body region in which the pattern of the readout-circuit portion $29_{i-1,j+1}$ is delineated, and the element isolation region $12_o$ and the channel-stop region 17 as illustrated in the cross-sectional view of FIG. 2 are disposed on the surface of the base-body region as an area continuous from the area of another pixel such as the (i–1,j)th pixel and the (i,j+1)th pixel.

The amplification transistors $QA_{i,j+1}$, $QA_{i-1,j}$, and $QA_{i-1,j+1}$ and the pixel-selection transistors $TS_{i,j+1}$, $TS_{i-1,j}$, and $TS_{i-1,j+1}$ illustrated in FIG. 7 may have such a π-type gate structure as illustrated in FIG. 8 and a ring-type gate structure in order to achieve radiation tolerance.

Particularly, in the solid-state image pickup device according to the first embodiment, when the buried charge-generation regions 13 of the respective pixels are the n-type regions as illustrated in FIG. 3, by applying a negative voltage to the transparent electrodes $21_{i,j}$, the effects of holes generated in the gate insulating films 23 of the respective pixels by irradiation of gamma rays are cancelled. Therefore, an increase in dark current is suppressed, and it is possible to obtain an image in which noise resulting from dark current is small and the dynamic range as a signal operating margin is maintained. That is, as described with reference to FIG. 3, when the buried charge-generation regions 13 of the respective pixels are n-type regions, since the minority carriers are holes, the inversion layer 14 is formed by a large number of holes at the interface between the semiconductor and the gate insulating film 23 immediately below the transparent electrode $21_{i,j}$, or the inversion layer 14 is formed in the surface of the buried charge-generation region 13, and the surface potential is pinned by holes of minority carriers. In the respective pixels, since the surface potential is pinned by the holes, the interface states at the interface between the semiconductor and the gate insulating film 23 are deactivated.

In the solid-state image pickup device according to the first embodiment, when gamma rays are irradiated to the respective pixels, although holes are generated in the thin gate insulating films 23 of the respective pixels, since the gate insulating films 23 are thin, an absolute quantity of the holes generated in the gate insulating films 23 of the respective pixels is small.

In the solid-state image pickup device according to the first embodiment, the charges photo-electrically converted in the buried charge-generation regions 13 immediately below the transparent electrodes $21_{i,j}$, $21_{i,j+1}$, $21_{i-1,j}$ and $21_{i-1,j+1}$ of the respective pixels are accumulated in the charge-readout regions $15_{i,j}$, $15_{i,j+1}$, $15_{i-1,j}$, and $15_{i-1,j+1}$ of the corresponding pixels for a predetermined period. Signals are read out from pixels in units of rows. First, the i-th row is selected according to the select signal SL(i) from the vertical shift register, and the signal levels of the charge-readout regions $15_{i,j}$, $15_{i,j+1}$, and the like are read. Subsequently, the charge-readout regions $15_{i,j}$, $15_{i,j+1}$, and the like are reset by the vertical shift register, and then, the reset levels of the charge-readout regions $15_{i,j}$, $15_{i,j+1}$, and the like are read. After that, the (i−1)th row is selected according to the select signal SL(i−1) from the vertical shift register, and the signal levels of the charge-readout regions $15_{i-1,j}$, $15_{i-1,j+1}$, and the like are read. Subsequently, the charge-readout regions $15_{i-1,j}$, $15_{i-1,j+1}$, and the like are reset by the vertical shift register, and then, the reset levels of the charge-readout regions $15_{i-1,j}$, $15_{i-1,j+1}$, and the like are read out. The signals read out from the pixels are subjected to correlated double sampling which reads the difference between the signal level and the reset level with the aid of the column processing circuit provided in the peripheral circuit in each column whereby the net signals in which an offset or the like is removed are transmitted sequentially. However, there is no noise correlation between the signal level and the reset level read out immediately after the signal level. Therefore, the reset noise is not removed by the correlated double sampling.

Second Embodiment

<Optical Detection Element According to Second Embodiment>

Figure 9:
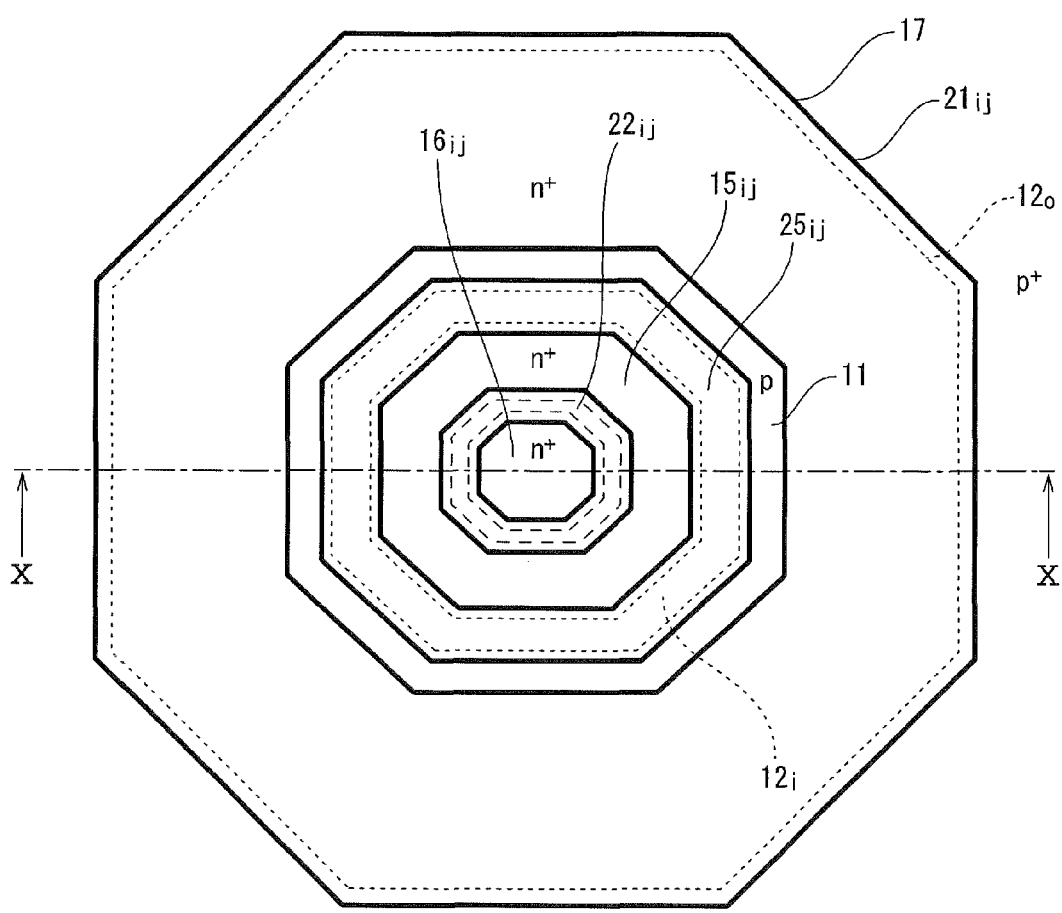
FIG. 9 is a schematic plan view illustrating a schematic structure of a main part of an optical detection element according to a second embodiment of the present invention.
Figure 10:
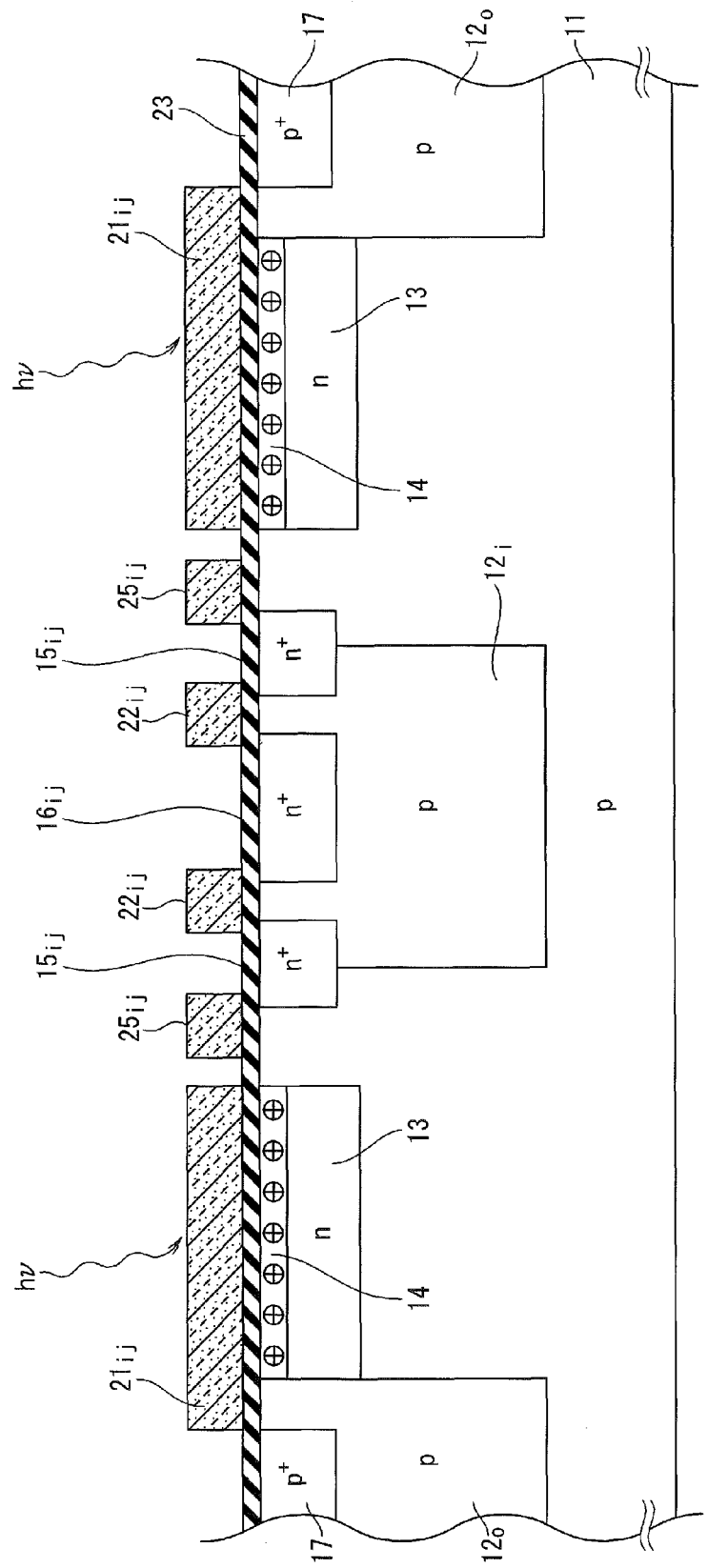
FIG. 10 is a cross-sectional view illustrating an exemplary cross-sectional structure of the optical detection element according to the second embodiment when seen from the direction X-X in FIG. 9.

As illustrated in FIGS. 9 and 10, an optical detection element according to a second embodiment of the present invention is the same as the optical detection element according to the first embodiment in that the optical detection element includes a base-body region 11 made of a semiconductor having a first conductivity type (p-type), a gate insulating film 23 contacted with an upper surface of the base-body region 11, a buried charge-generation region 13 of a second conductivity type (n-type) buried with an annular form (a ring form in the plan view of FIG. 9) in an upper portion of the base-body region 11 in contact with the gate insulating film 23, a charge-readout region $15_{i,j}$ of the second conductivity type having a high impurity concentration than the buried charge-generation region 13, buried with an annular form in an upper portion of the base-body region 11 at a position close to an inner-contour side of the buried charge-generation region 13, a reset-drain region $16_{i,j}$ of the second conductivity type having a higher impurity concentration than the buried charge-generation region 13, buried on the inner-contour side of the charge-readout region $15_{i,j}$ in a state of being separated from the charge-readout region $15_{i,j}$, a transparent electrode $21_{i,j}$ provided in an annular form on the gate insulating film 23 above the buried charge-generation region 13, and a reset-gate electrode $22_{i,j}$ provided on the gate insulating film 23 above the base-body region 11 between the charge-readout region $15_{i,j}$ and the reset-drain region $16_{i,j}$.

However, as illustrated in FIG. 10, the difference from the optical detection element according to the first embodiment is that the buried charge-generation region 13 and the charge-readout region $15_{i,j}$ are separated from each other via the base-body region 11, which is interposed between the buried charge-generation region 13 and the charge-readout region $15_{i,j}$. Moreover, a transfer-gate electrode $25_{i,j}$ is further stacked on the gate insulating film 23 which is allocated above the base-body region 11 between the buried charge-generation region 13 and the charge-readout region $15_{i,j}$. When a voltage is applied to the transfer-gate electrode $25_{i,j}$, signal charges are transferred from the buried charge-generation region 13 to the charge-readout region $15_{i,j}$. The space between the transfer-gate electrode $25_{i,j}$ and the transparent electrode $21_{i,j}$ may be designed as small as possible.

In the plan view of FIG. 9, although a continuous belt-like shape in which both the shapes on an outer-contour side and an inner-contour side of the transparent electrode $21_{i,j}$, the transfer-gate electrode $25_{i,j}$, and the reset-gate electrode $22_{i,j}$ have an octagonal shape is illustrated as an example of an annular topology, the annular topology is not limited to the topology illustrated in FIG. 9. That is, the shapes of the transparent electrode $21_{i,j}$, the transfer-gate electrode $25_{i,j}$, and the reset-gate electrode $22_{i,j}$ may be another continuous shapes, such that the reset-drain region $16_{i,j}$ can be surrounded by an outer-contour line and an inner-contour line of a circle or another polygon having an approximately fixed width. Moreover, it is not necessary that the planar pattern is point-symmetric about the center of the reset-drain region $16_{i,j}$ as long as the planar pattern is a topology of such a closed continuous belt that surrounds the reset-drain region $16_{i,j}$ with an approximately fixed belt width.

As illustrated in FIG. 9, in the optical detection element according to the second embodiment, the transparent electrode $21_{i,j}$ is delineated into an annular form on the outer side of the optical detection element, the transfer-gate electrode $25_{i,j}$ is delineated into an annular form on the inner side of the pattern of the transparent electrode $21_{i,j}$, and the charge-readout region $15_{i,j}$ is arranged in the inner side of the pattern of the transfer-gate electrode $25_{i,j}$. Actually, depending on a thermal process, as indicated by a broken line in the plan view of FIG. 9, impurity atoms of the second conductivity type that implement the charge-readout region $15_{i,j}$ are allowed to diffuse thermally in a lateral direction further than a boundary position of a pattern determined by a mask level so that a planar pattern in which the outer-contour line of the charge-readout region $15_{i,j}$ is positioned in a region slightly closer to the outer side than the inner-contour line of the transfer-gate electrode $25_{i,j}$ is obtained. Similarly, in the plan view of FIG. 9, although the annular reset-gate electrode $22_{i,j}$ is disposed on the inner side of the charge-readout region $15_{i,j}$, as indicated by a broken line, impurity atoms of the second conductivity type that implement the charge-readout region $15_{i,j}$ are allowed to diffuse thermally in a lateral direction further than a boundary position of a pattern determined by a mask level so that a planar pattern in which the inner-contour line of the charge-readout region $15_{i,j}$ is positioned slightly closer to the inner side than the outer-contour line of the reset-gate electrode $22_{i,j}$ is obtained. The corresponding cross-sectional view of FIG. 10 illustrates a state in which lateral ends of the charge-readout region $15_{i,j}$ slightly overlap an inner end of the transfer-gate electrode $25_{i,j}$ and an outer end of the reset-gate electrode $22_{i,j}$. It is also possible non-overlap cases both just according and slightly separating between lateral ends of the charge-readout region $15_{i,j}$ and an inner end of the transfer-gate electrode $25_{i,j}$ and between lateral ends of the charge-readout region $15_{i,j}$ and an outer end of the reset-gate electrode $22_{i,j}$. By providing the annular reset-gate electrode $22_{i,j}$ on the inner side of the charge-readout region $15_{i,j}$, it is possible to suppress a turn-off leakage current due to irradiation of radiant lay at a channel-sidewall oxide-film boundary, which is inevitable in a general transistor in which the gate shape is square.

In the plan view of FIG. 9, although the reset-drain region $16_{i,j}$ is disposed on the inner side of the reset-gate electrode $22_{i,j}$, as indicated by a broken line, impurity atoms of the second conductivity type that implement the reset-drain region $16_{i,j}$ are allowed to diffuse thermally in a lateral direction further than a boundary position of a pattern determined by a mask level so that a planar pattern in which the outer-contour line of the reset-drain region $16_{i,j}$ is positioned in a region slightly closer to the outer side than the inner-contour line of the reset-gate electrode $22_{i,j}$ is obtained. The corresponding cross-sectional view of FIG. 10 illustrates a state in which lateral ends of the reset-drain region $16_{i,j}$ overlap inner ends of the reset-gate electrode $22_{i,j}$.

As illustrated in FIG. 10, a well region $12_i$ of a first conductivity type having a higher impurity concentration than the base-body region 11 is buried in an upper portion of the base-body region 11 immediately below the reset-gate electrode $22_{i,j}$. Although the planar pattern is not illustrated, the well region $12_i$ is arranged in an octagonal form so as to surround the reset-drain region $16_{i,j}$. And the outer-contour line of the well region $12_i$ in the planar pattern is delineated into an octagonal shape, which is sandwiched between the outer-contour line and the inner-contour line of the charge-readout region $15_{i,j}$. It can be understood from the cross-sectional view of FIG. 10, the well region $12_i$ is disposed to surround the entire side plane and the entire bottom plane of the reset-drain region $16_{i,j}$ and the side plane of the well region $12_i$ is in contact with the bottom plane of the charge-readout region $15_{i,j}$. Furthermore, as illustrated in FIG. 10, the buried charge-generation region 13 and the well region $12_i$ are separated from each other via the base-body region 11, which is interposed between the buried charge-generation region 13 and the well region $12_i$.

As will be described later, in order to completely transfer charges from the buried charge-generation region 13 to the charge-readout region $15_{i,j}$, although not illustrated in the Drawing, common or individual implantation layers may be buried in the surface side portion of the spaced area between the transfer-gate electrode $25_{i,j}$ and the transparent electrode $21_{i,j}$, or in the surface side portion of the base-body region 11 under the transfer-gate electrode $25_{i,j}$.

In the optical detection element according to the second embodiment illustrated in FIG. 10, since the well region $12_i$ is implemented by a p-type semiconductor region, a reset transistor is implemented by an nMOS transistor that includes the reset-gate electrode $22_{i,j}$, the gate insulating film 23, the well region $12_i$, the charge-readout region $15_{i,j}$, and the reset-drain region $16_{i,j}$. Moreover, a voltage is applied to the reset-gate electrode $22_{i,j}$ to exhaust the charges accumulated in the charge-readout region $15_{i,j}$ to the reset-drain region $16_{i,j}$ to reset the charges accumulated in the charge-readout region $15_{i,j}$.

As illustrated on both end sides of the cross-sectional view of FIG. 10, an element isolation region $12_o$ of the first conductivity type having a higher impurity concentration than the base-body region 11 is disposed on the outer side of the transparent electrode $21_{i,j}$ so as to surround the buried charge-generation region 13. Furthermore, a channel-stop region 17 of the first conductivity type having a higher impurity concentration than the element isolation region $12_o$ is buried in the surface portion of the element isolation region $12_o$. As indicated by the broken line in the plan view of FIG. 9, depending on a thermal process, impurity atoms of the first conductivity type that implement the element isolation region $12_o$ may thermally diffuse in a lateral direction further than a boundary position of a pattern determined by a mask level so that a planar pattern in which the inner-contour line of the element isolation region $12_o$ is positioned in a region closer to the inner side than the outer-contour line of the transparent electrode $21_{i,j}$ is obtained.

Since the inner-contour line of the element isolation region $12_o$ is delineated into a planar pattern that the inner-contour line is positioned closer to the inner side than the outer-contour line of the transparent electrode $21_{i,j}$ at an equal interval, the inner-contour line of the element isolation region $12_o$ is delineated into a closed geometric shape. On the other hand, because the inner-contour line of the channel-stop region 17 surrounds the planar pattern of the transparent electrode $21_{i,j}$, the inner-contour line of the channel-stop region 17 is also delineated into a closed geometric shape. Since the element isolation region $12_o$ is disposed on the outer side of the transparent electrode $21_{i,j}$, it is possible to suppress the generation of a dark current in the peripheral portion of the buried charge-generation region 13 buried immediately below the transparent electrode $21_{i,j}$.

Although the planar pattern is not illustrated, the topology of the buried charge-generation region 13 buried in the surface side portion of the base-body region 11 has a closed geometric shape. That is, the outer-contour line of the buried charge-generation region 13 is a line that is delineated into an octagonal shape that is common to the inner-contour line of the element isolation region $12_o$ in FIG. 9. And the inner-contour line of the buried charge-generation region 13 on the planar pattern of FIG. 9 is delineated into an octagonal shape that is common to the inner-contour line of the transparent electrode $21_{i,j}$. In this manner, the octagonal buried charge-generation region 13 is provided in an annular form at the surface side of the base-body region 11, and the annular and octagonal transparent electrode $21_{i,j}$ is provided on the annular and octagonal buried charge-generation region 13 with the thin gate insulating film 23 interposed between the buried charge-generation region 13 and the transparent electrode $21_{i,j}$.

When the transparent electrode $21_{i,j}$ is formed using a doped-polysilicon similarly to the optical detection element according to the first embodiment, it is convenient from the viewpoint of the manufacturing process because the boundary between the transparent electrode $21_{i,j}$ and the charge-readout region $15_{i,j}$ can be self-aligned. An oxide thin film (a transparent conductive oxide) such as ITO may be used.

When a doped-polysilicon is used for the reset-gate electrode $22_{i,j}$ similarly to the optical detection element according to the first embodiment, it is preferable because the boundary between the reset-gate electrode $22_{i,j}$ and the charge-readout region $15_{i,j}$ and the boundary between the reset-gate electrode $22_{i,j}$ and the reset-drain region $16_{i,j}$ can be self-aligned.

In the optical detection element according to the second embodiment, when a negative voltage is applied to the transparent electrode $21_{i,j}$, as illustrated in FIG. 3, when a potential of the transparent electrode $21_{i,j}$ applies to the surface of the buried charge-generation region 13 via the gate insulating film 23, a surface potential of the buried charge-generation region 13 is pinned to the surface of the buried charge-generation region 13 by charges of the minority carriers in the buried charge-generation region 13. That is, if the buried charge-generation region 13 is an n-type region, when an inversion layer 14 is induced by a large number of holes in the surface portion of the charge-readout region $15_{i,j}$ immediately below the transparent electrode $21_{i,j}$ and the surface potential is pinned by holes, the interface states at the interface between the semiconductor and the gate insulating film 23 is deactivated. Moreover, when gamma rays are irradiated to the optical detection element according to the second embodiment, although holes are generated in the thin gate insulating film 23, since the gate insulating film 23 is thin, an absolute quantity of the holes generated in the gate insulating film 23 is small.

Figure 11:
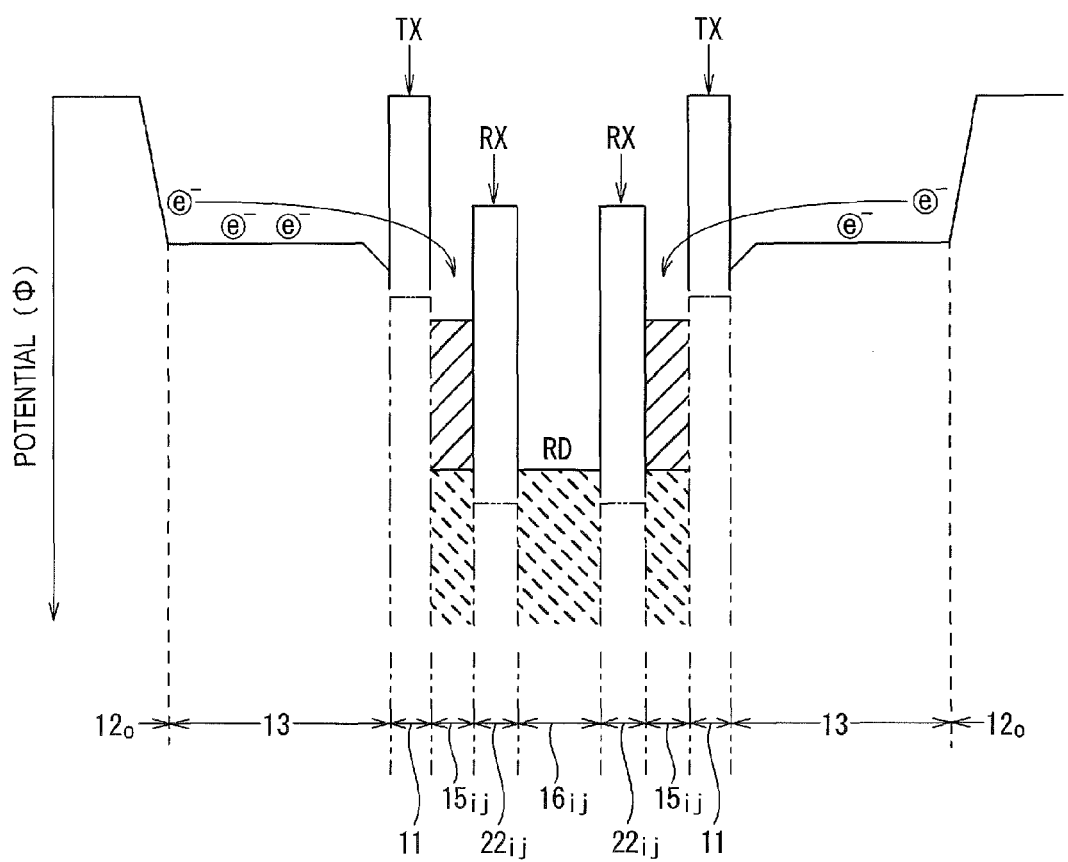
FIG. 11 is a diagram for describing a potential profile corresponding to a structure including an element isolation region, a buried charge-generation region, a base-body region, a charge-readout region, a reset-gate electrode, and a reset-drain region at the center illustrated in the cross-sectional view of FIG. 10 and movement of signal charges in the potential profile (when a transfer-gate TX is high)

FIG. 11 is a diagram corresponding to the lateral positions illustrated in the cross-sectional view of FIG. 10 and is a diagram illustrating an example of a potential distribution having a center-symmetric profile extending from the element isolation regions $12_o$ on the outer sides to the reset-drain region $16_{i,j}$ at the center, via the buried charge-generation region 13, the base-body region 11, the charge-readout region $15_{i,j}$, and the reset-gate electrode $22_{i,j}$. A potential level indicated by symbol RD at the bottom of a well at the center of FIG. 11, or the potential level of the upper end of an area hatched with top-left diagonal broken line in FIG. 11, is a reset voltage VRD which is the voltage of the reset-drain region $16_{i,j}$.

In the optical detection element according to the second embodiment, as illustrated in FIG. 11, when a depletion potential of a channel immediately below the transparent electrode $21_{i,j}$ is set to be lower than the potential of the charge-readout region $15_{i,j}$, the signal charges photo-electrically converted in the transparent electrode $21_{i,j}$ are transferred to the charge-readout region $15_{i,j}$ as the transfer-gate electrode $25_{i,j}$ is turned on. That is, the signal charges (electrons) generated in the buried charge-generation region 13 immediately below the transparent electrode $21_{i,j}$ are transferred from the buried charge-generation region 13 to the charge-readout region $15_{i,j}$ on the inner side, by controlling the surface potential of the channel formed in the surface portion of the base-body region 11, according to the voltage applied to the transfer-gate electrode $25_{i,j}$, as indicated by arrows directed toward the center of FIG. 11. In FIG. 11, the charges transferred via the channel in the surface portion of the base-body region 11 by the transfer-gate electrode $25_{i,j}$ and accumulated in the charge-readout region $15_{i,j}$ are depicted by an area hatched with top-right diagonal solid lines. By implementing such a potential distribution profile as illustrated in FIG. 11, it is possible to decrease the capacitance of the charge-readout region $15_{i,j}$ of the optical detection element according to the second embodiment and to increase the conversion gain of signal charges. Therefore, it is possible to increase the voltage-sensitivity of the optical detection element according to the second embodiment.

When the channel potential under the transfer-gate electrode $25_{i,j}$ is not set appropriately, a potential dip or barrier is formed in the transfer path from the buried charge-generation region 13 to the charge-readout region $15_{i,j}$ and incomplete charge transfer may occur. In order to prevent this, as described above, common or individual injection layers may be buried in the surface side portion of the spaced area between the transfer-gate electrode $25_{i,j}$ and the transparent electrode $21_{i,j}$, or in the surface side portion of the base-body region 11 under the transfer-gate electrode $25_{i,j}$.

In the structure of the optical detection element according to the second embodiment, at the beginning, the charges photo-electrically converted in the buried charge-generation region 13 immediately below the transparent electrode $21_{i,j}$ are accumulated in the buried charge-generation region 13 for a predetermined period. Subsequently, the charge-readout region $15_{i,j}$ is reset and the reset potential is read out. Immediately after that, the transfer-gate electrode $25_{i,j}$ is turned on so that the charges accumulated in the buried charge-generation region 13 can be transferred to the charge-readout region $15_{i,j}$ and the signal level of the charge-readout region $15_{i,j}$ can be read out. In the operation of the optical detection element according to the second embodiment, there is noise correlation between the reset level and the signal level read immediately after the reset level. Thus, as will be described later, when correlated double sampling which reads the difference between the reset level and the signal level is performed with the aid of a column circuit or the like, it is possible to obtain net low-noise signals in which reset noise as well as an offset is removed.

<Solid-State Image Pickup Device According to Second Embodiment>

Figure 12:
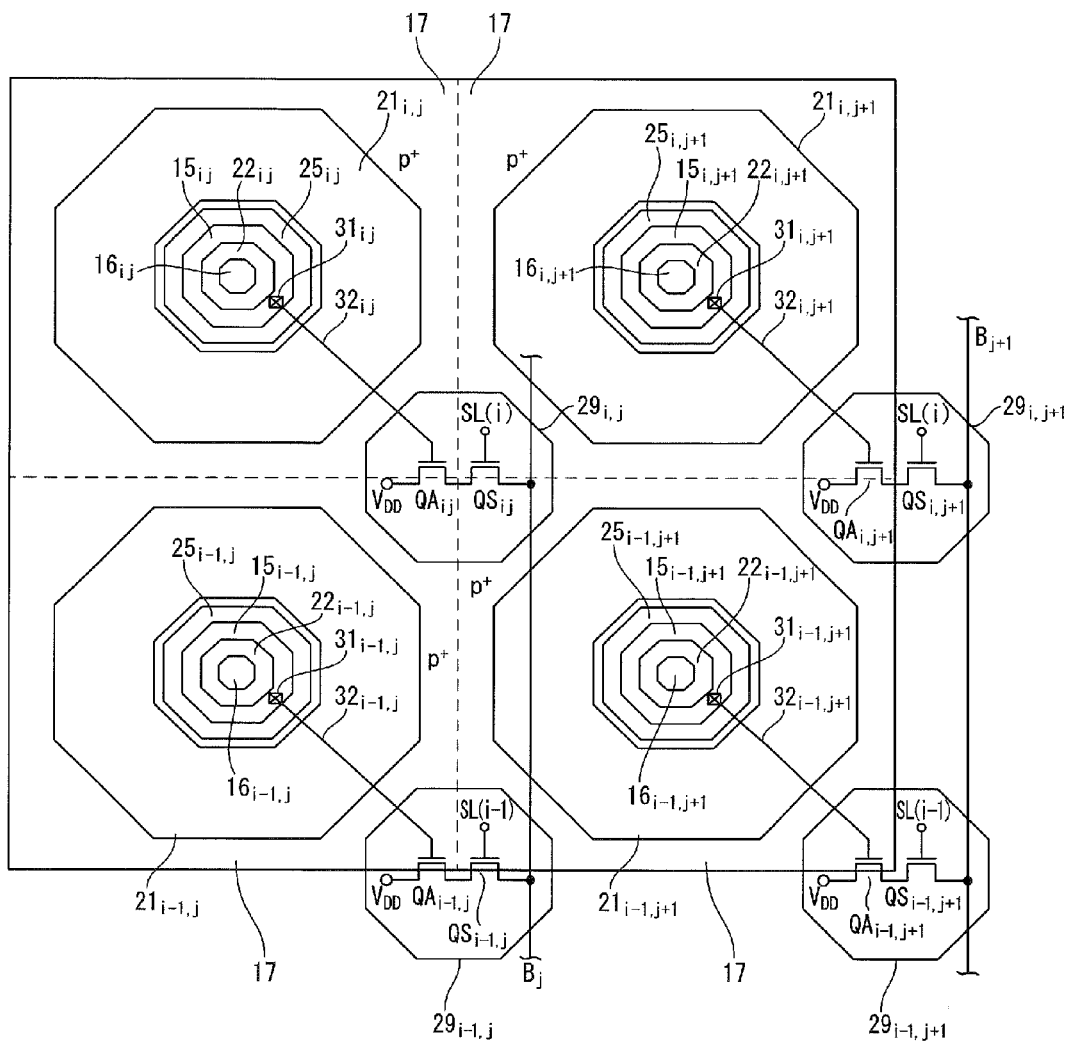
FIG. 12 is a schematic plan view illustrating a schematic structure of a main part of a 2×2 matrix that implements a portion of a pixel array area of a solid-state image pickup device (a CMOS image sensor) according to the second embodiment of the present invention.
Figure 13:
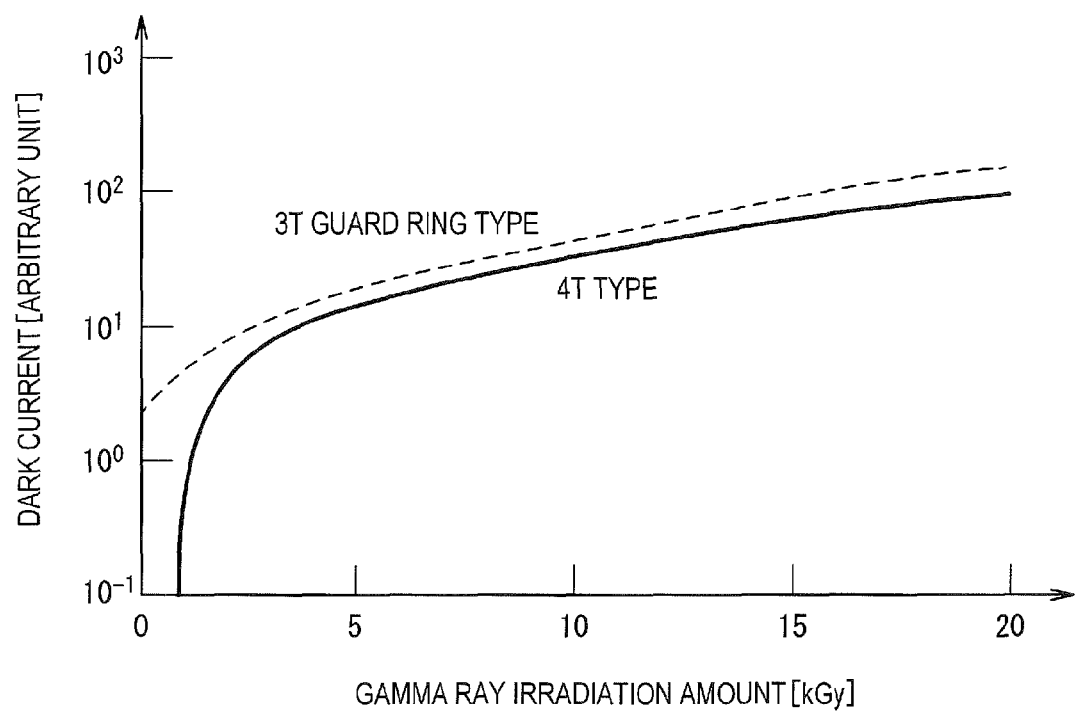
FIG. 13 is a diagram for describing how a dark current increases in a log scale when gamma rays are irradiated to an earlier CMOS image sensor.

When a plurality of unit pixels are arranged in a two-dimensional matrix form using the optical detection element having the structure illustrated in FIGS. 9 and 10 as a unit pixel, it is possible to implement a pixel array area of a solid-state image pickup device (two-dimensional image sensor) according to the second embodiment of the present invention. For the sake of convenience, FIG. 12 schematically illustrates the pixel array area of the solid-state image pickup device according to the second embodiment using a planar structure in which four unit pixels within the matrix arrangement of the plurality of unit pixels that implement the pixel array area are two-dimensionally arranged in a 2×2 matrix form similarly to the solid-state image pickup device according to the first embodiment. That is, the solid-state image pickup device according to the second embodiment illustrated in FIG. 12 illustrates an example of a planar pattern when the 2×2 matrix structure within the pixel array area is implemented by a (i,j)th pixel at the top-left corner, a (i,j+1)th pixel at the top-right corner, a (i−1,j)th pixel at the bottom-left corner, and a (i−1,j+1)th pixel at the bottom-right corner.

The cross-sectional structure of the (i,j)th pixel that implements the solid-state image pickup device according to the second embodiment illustrated at the top-left corner of FIG. 12 is the same as the cross-sectional structure of the optical detection element illustrated in FIG. 10 since the optical detection element illustrated in FIG. 10 is used as the unit pixel. Therefore, although the base-body region 11, the gate insulating film 23, the buried charge-generation region 13, and the like illustrated in FIG. 10 are not depicted in the plan view of FIG. 12, the cross-sectional structure of the (i,j)th pixel is basically completely the same as the cross-sectional structure illustrated in FIG. 10.

That is, the (i,j)th pixel that implements the solid-state image pickup device according to the second embodiment illustrated at the top-left corner of FIG. 12 includes a base-body region (not illustrated) made of a semiconductor of the first conductivity type, a gate insulating film (not illustrated) contacted with an upper surface of the base-body region, a buried charge-generation region (not illustrated) of the second conductivity type buried with an annular form in an upper portion of the base-body region, being contacted with the gate insulating film, the charge-readout region $15_{i,j}$ of the second conductivity type having a high impurity concentration than the buried charge-generation region, buried with an annular form in an upper portion of the base-body region at a position close to an inner-contour side of the buried charge-generation region, the reset-drain region $16_{i,j}$ having a higher impurity concentration than the buried charge-generation region, buried on the inner-contour side of the charge-readout region $15_{i,j}$ in a state of being separated from the charge-readout region $15_{i,j}$, the transparent electrode $21_{i,j}$ provided in an annular form on the gate insulating film above the buried charge-generation region 13, and the reset-gate electrode $22_{i,j}$ provided on the gate insulating film above the base-body region between the charge-readout region $15_{i,j}$ and the reset-drain region $16_{i,j}$. Although not illustrated in FIG. 12, similarly to the cross-sectional structure illustrated in FIG. 10, the buried charge-generation region and the charge-readout region $15_{i,j}$ are separated from each other via the base-body region 11, which is interposed between the buried charge-generation region and the charge-readout region $15_{i,j}$. And the transfer-gate electrode $25_{i,j}$ is stacked on the gate insulating film 23 which is allocated above the base-body region 11 between the buried charge-generation region 13 and the charge-readout region $15_{i,j}$. When a voltage is applied to the transfer-gate electrode $25_{i,j}$, signal charges are transferred from the buried charge-generation region 13 to the charge-readout region $15_{i,j}$. The well region $12_i$ of the first conductivity type having a higher impurity concentration than the base-body region is buried in an upper portion of the base-body region immediately below the reset-gate electrode $22_{i,j}$. Similarly to the cross-sectional structure illustrated in FIG. 10, the element isolation region of the first conductivity type having a higher impurity concentration than the base-body region is buried at the outer side of the transparent electrode $21_{i,j}$ so as to surround the buried charge-generation region 13. Furthermore, the channel-stop region 17 of the first conductivity type having a higher impurity concentration than the element isolation region is buried in the surface portion of the element isolation region.

Similarly, as illustrated in at the top-right corner of FIG. 12, the (i,j+1)th pixel in the two-dimensional matrix includes a base-body region of the first conductivity type, a gate insulating film contacted with the upper surface of the base-body region, a buried charge-generation region of the second conductivity type buried with an annular form in an upper portion of the base-body region, being contacted with the gate insulating film, a charge-readout region $15_{i,j+1}$ of the second conductivity type having a higher impurity concentration than the buried charge-generation region, buried on the inner-contour side of the buried charge-generation region, a reset-drain region $16_{i,j+1}$ having a higher impurity concentration than the buried charge-generation region, buried on the inner-contour side of the charge-readout region $15_{i,j+1}$ in a state of being separated from the charge-readout region $15_{i,j+1}$, a transparent electrode $21_{i,j+1}$ provided in an annular form on the gate insulating film above the buried charge-generation region 13, and a reset-gate electrode $22_{i,j+1}$ provided on the gate insulating film above the well region $12_i$ between the charge-readout region $15_{i,j+1}$ and the reset-drain region $16_{i,j+1}$. Similarly to the structure illustrated in FIG. 10, the buried charge-generation region 13 and the charge-readout region $15_{i,j+1}$ are separated from each other via the base-body region 11, which is interposed between the buried charge-generation region and the charge-readout region $15_{i,j+1}$. And the transfer-gate electrode $25_{i,j+1}$ is stacked on the gate insulating film 23 which is allocated above the base-body region 11 between the buried charge-generation region 13 and the charge-readout region $15_{i,j+1}$. When a voltage is applied to the transfer-gate electrode $25_{i,j+1}$, signal charges are transferred from the buried charge-generation region 13 to the charge-readout region $15_{i,j+1}$. The well region $12_i$ of the first conductivity type having a higher impurity concentration than the base-body region is disposed below the reset-gate electrode $22_{i,j+1}$, and an element isolation region of the first conductivity type having a higher impurity concentration than the base-body region is disposed on the outer side of the transparent electrode $21_{i,j+1}$ as an area continuous from the area of another pixel such as the (i,j)th pixel so as to surround the buried charge-generation region 13. Moreover, the channel-stop region 17 of the first conductivity type having a higher impurity concentration than the element isolation region is buried in the surface portion of the element isolation region as an area continuous from the area of another pixel such as the (i,j)th pixel.

Moreover, as illustrated at the bottom-left corner of FIG. 12, the (i−1,j)th pixel in the two-dimensional matrix includes a base-body region of the first conductivity type, a gate insulating film contacted with the upper surface of the base-body region, a buried charge-generation region of the second conductivity type buried in an upper portion of the base-body region, being contacted with the gate insulating film, a charge-readout region $15_{i-1,j}$ of the second conductivity type having a higher impurity concentration than the buried charge-generation region, buried on the inner-contour side of the buried charge-generation region, a reset-drain region $16_{i-1,j}$ having a higher impurity concentration than the buried charge-generation region, buried on the inner-contour side of the charge-readout region $15_{i-1,j}$, a transparent electrode $21_{i-1,j}$ provided above the buried charge-generation region 13, and a reset-gate electrode $22_{i-1,j}$ provided above between the charge-readout region $15_{i-1,j}$ and the reset-drain region $16_{i-1,j}$. Similarly to the structure illustrated in FIG. 10, the buried charge-generation region and the charge-readout region $15_{i-1,j}$ are separated from each other via the base-body region 11, which is interposed between the buried charge-generation region and the charge-readout region $15_{i-1,j}$. And the transfer-gate electrode $25_{i-1,j}$ is stacked on the gate insulating film 23 which is allocated above the base-body region 11 between the buried charge-generation region 13 and the charge-readout region $15_{i-1,j}$. When a voltage is applied to the transfer-gate electrode $25_{i-1,j}$, signal charges are transferred from the buried charge-generation region 13 to the charge-readout region $15_{i-1,j}$. The well region $12_{i-1}$ of the first conductivity type having a higher impurity concentration than the base-body region is disposed below the reset-gate electrode $22_{i-1,j}$, and an element isolation region of the first conductivity type having a higher impurity concentration than the base-body region is disposed on the outer side of the transparent electrode $21_{i-1,j}$ as an area continuous from the area of another pixel such as the (i,j)th pixel so as to surround the buried charge-generation region 13. Moreover, the channel-stop region 17 of the first conductivity type having a higher impurity concentration than the element isolation region is buried in the surface portion of the element isolation region as an area continuous from the area of another pixel such as the (i,j)th pixel.

Moreover, as illustrated at the bottom-right corner of FIG. 12, the (i−1,j+1)th pixel in the two-dimensional matrix includes a base-body region of the first conductivity type, a gate insulating film contacted with the upper surface of the base-body region, a buried charge-generation region of the second conductivity type buried in an upper portion of the base-body region, being contacted with the gate insulating film, a charge-readout region $15_{i-1,j+1}$ of the second conductivity type having a higher impurity concentration than the buried charge-generation region, buried on the inner-contour side of the buried charge-generation region, a reset-drain region $16_{i-1,j+1}$ having a higher impurity concentration than the buried charge-generation region, buried on the inner-contour side of the charge-readout region $15_{i-1,j+1}$, a transparent electrode $21_{i-1,j+1}$ stacked on the gate insulating film above the buried charge-generation region 13, and a reset-gate electrode $22_{i-1,j+1}$ stacked on the gate insulating film above the well region 12*i* between the charge-readout region $15_{i-1,j+1}$ and the reset-drain region $16_{i-1,j+1}$. Similarly to the structure illustrated in FIG. 10, the buried charge-generation region 13 and the charge-readout region $15_{i-1,j+1}$ are separated from each other via the base-body region 11, which is interposed between the buried charge-generation region 13 and the charge-readout region $15_{i-1,j+1}$, and the transfer-gate electrode $25_{i-1,j+1}$ is stacked on the gate insulating film 23 which is allocated above the base-body region 11 between the buried charge-generation region 13 and the charge-readout region $15_{i-1,j+1}$. When a voltage is applied to the transfer-gate electrode $25_{i-1,j+1}$, signal charges are transferred from the buried charge-generation region 13 to the charge-readout region $15_{i-1,j+1}$. The well region $12_{i-1}$ of the first conductivity type having a higher impurity concentration than the base-body region is disposed below the reset-gate electrode $22_{i-1,j+1}$, and an element isolation region of the first conductivity type having a higher impurity concentration than the base-body region is disposed on the outer side of the transparent electrode $21_{i-1,j+1}$ as an area continuous from the area of another pixel such as the (i−1,j)th pixel and (i,j+1)th pixel so as to surround the buried charge-generation region 13. Moreover, the channel-stop region 17 of the first conductivity type having a higher impurity concentration than the element isolation region is buried in the surface portion of the element isolation region as an area continuous from the area of another pixel such as the (i−1,j)th pixel and (i,j+1)th pixel.

As illustrated in FIG. 12, one end of a surface interconnection $32_{i,j}$ extending in a bottom-right direction is connected to the charge-readout region $15_{i,j}$ of the (i,j)th pixel in the two-dimensional matrix via a contact hole $31_{i,j}$, and a gate electrode of an amplification transistor $QA_{i,j}$ of a readout-circuit portion $29_{i,j}$ is connected to the other end of the surface interconnection $32_{i,j}$.

That is, in the circuit structure illustrated in FIG. 12, since the charge-readout region $15_{i,j}$ functions as a source region of a reset transistor, the gate electrode of the amplification transistor $QA_{i,j}$ and a source region of the reset transistor $TR_{i,j}$ are connected to the charge-readout region $15_{i,j}$.

The surface interconnection $32_{i,j}$ illustrated in FIG. 12 is an exemplary representation on a schematic equivalent circuit, and actually, does not need to be such a wiring extending in the bottom-right direction as illustrated in FIG. 12. A drain region of a pixel-selection transistor (switching transistor) $TS_{i,j}$ is connected to the source region of the amplification transistor $QA_{i,j}$ and a power supply wiring $V_{DD}$ is connected to the drain region of the amplification transistor $QA_{i,j}$. The vertical signal line $B_j$ arranged along the j-th column is connected to the source region of the pixel-selection transistor $TS_{i,j}$ and a select signal SL(i) of the i-th row is fed to the gate electrode of the pixel-selection transistor $TS_{i,j}$. By the voltage corresponding to the amount of charges transferred to the charge-readout region $15_{i,j}$, the output signal amplified by the amplification transistor $QA_{i,j}$ is transmitted to the vertical signal line $B_j$ via the pixel-selection transistor $TS_{i,j}$.

In FIG. 12, the octagonal outer-contour line indicating the readout-circuit portion $29_{i,j}$ indicates an outer boundary of a field-insulating film area for arranging the amplification transistor $QA_{i,j}$ and the pixel-selection transistor $TS_{i,j}$. A thick oxide film corresponding to the field-insulating film is provided between an active area of the amplification transistor $QA_{i,j}$ and an active area of the pixel-selection transistor $TS_{i,j}$ in the readout-circuit portion $29_{i,j}$. A thick oxide film is not present between the surface of the base-body region in which the pattern of the transparent electrode $21_{i,j}$ is disposed and the surface of the base-body region in which the pattern of the readout-circuit portion $29_{i,j}$ is disposed, and the element isolation region $12_o$ and the channel-stop region 17 as illustrated in the cross-sectional view of FIG. 10 are buried in the surface portion of the base-body region as an area continuous from the area of another pixel in the two-dimensional matrix.

The amplification transistor $QA_{i,j}$ and the pixel-selection transistor $TS_{i,j}$ illustrated in FIG. 12 may have a gate structure having a ring form or such a π-type as illustrated in FIG. 8 in order to achieve radiation tolerance similarly to the solid-state image pickup device according to the first embodiment. Since the structure other than the structure of the charge-readout regions $15_{i,j+1}$, $15_{i-1,j}$, and $15_{i-1,j+1}$ of the (i,j+1)th, (i−1,j)th, and (i−1,j+1)th pixels is substantially the same as that of the solid-state image pickup device according to the first embodiment, the redundant description will not be provided.

In the solid-state image pickup device according to the second embodiment, as described above with reference to FIG. 3, when the buried charge-generation regions 13 of the respective pixels are the n-type regions, by applying a negative voltage to the transparent electrodes $21_{i,j}$, the effects of holes generated in the gate insulating films 23 of the respective pixels by irradiation of gamma rays are cancelled. Therefore, in the solid-state image pickup device according to the second embodiment, an increase in dark current is suppressed, and it is possible to obtain an image in which noise resulting from dark current is small and the dynamic range as a signal operating margin is maintained similarly to the solid-state image pickup device according to the first embodiment.

The operation of the solid-state image pickup device according to the second embodiment is different from that of the solid-state image pickup device according to the first embodiment. First, the charges photo-electrically converted in the buried charge-generation regions 13 immediately below the transparent electrodes $21_{i,j}$, $21_{i,j+1}$, $21_{i-1,j}$ and $21_{i-1,j+1}$ of the respective pixels are accumulated in the corresponding buried charge-generation regions 13 for a predetermined period. Signals are read out from pixels in units of rows. First, the i-th row is selected according to the select signal SL(i) from the vertical shift register, the charge-readout regions $15_{i,j}$, $15_{i,j+1}$, and the like are reset by the vertical shift register, and the reset levels are read out. Subsequently, the transfer-gate electrodes $25_{i,j}$, $25_{i,j+1}$, and the like are turned on by the vertical shift register, whereby the charges accumulated in the corresponding buried charge-generation regions 13 are transferred to the charge-readout regions $15_{i,j}$, $15_{i,j+1}$, and the like, and the signal levels of the charge-readout regions $15_{i,j}$, $15_{i,j+1}$, and the like are read out.

After that, the (i−1)th row is selected according to the select signal SL(i−1) from the vertical shift register, the charge-readout regions $15_{i-1,j}$, $15_{i-1,j+1}$, and the like are reset by the vertical shift register, and the reset levels are read out. Subsequently, the corresponding transfer-gate electrodes $25_{i-1,j}$, $25_{i-1,j+1}$, and the like are turned on by the vertical shift register, whereby the charges accumulated in the respective buried charge-generation regions 13 are transferred to the corresponding charge-readout regions $15_{i-1,j}$, $15_{i-1,j+1}$, and the like, and the signal levels of the charge-readout regions $15_{i-1,j}$, $15_{i-1,j+1}$, and the like are read out.

The signals read out from the pixels are subjected to correlated double sampling which reads the difference between the signal level and the reset level with the aid of the column processing circuit provided in the peripheral circuit in each column whereby the net signals in which an offset or the like is removed are transmitted sequentially. Furthermore, in the solid-state image pickup device according to the second embodiment, there is noise correlation between the reset level and the signal level read immediately after the noise level. Therefore, by correlated double sampling, it is possible to obtain net low-noise, high-sensitivity signals in which reset noise as well as an offset is removed.

Other Embodiments

As described above, while the present invention has been described above with reference to the embodiments, it should be understood that discussion and Drawings which are incorporated herein are not intended to limit the present invention. Various alternative embodiments, examples, and operational techniques will be apparent to those skilled in the art from the description above.

For example, in the description of the first and second embodiments, although a two-dimensional solid-state image pickup device (area sensor) has been described as an example, the solid-state image pickup device of the present invention is not to be intended to be limited to the two-dimensional solid-state image pickup device only. For example, it can be easily understood from the content of the disclosure that a one-dimensional solid-state image pickup device (line sensor) may be implemented using the array of one line of the two-dimensional matrix illustrated in FIG. 1.

Naturally, the present invention includes many other embodiments not described herein. Therefore, the technical scope of the present invention is determined only by the present invention identification matters according to claims reasonable from the foregoing description.

What is claimed is:

1. An optical detection element comprising:
   a base-body region made of a semiconductor having a first conductivity type;
   a gate insulating film contacted with an upper surface of the base-body region;
   a buried charge-generation region of a second conductivity type buried with an annular form in an upper portion of the base-body region, being contacted with the gate insulating film;
   a charge-readout region of the second conductivity type having a higher impurity concentration than the buried charge-generation region, buried with an annular form in the upper portion of the base-body region at a position on an inner-contour side of the buried charge-generation region;
   a reset-drain region of the second conductivity type having a higher impurity concentration than the buried charge-generation region, buried in the upper portion of the base-body region at a position on the inner-contour side of the charge-readout region, being separated from the charge-readout region;
   a transparent electrode provided in an annular form on the gate insulating film, allocated above the buried charge-generation region; and
   a reset-gate electrode stacked on the gate insulating film, allocated above the base-body region between the charge-readout region and the reset-drain region,
   wherein a surface potential in the surface portion of the buried charge-generation region is pinned by charges of minority carriers in the buried charge-generation region.

2. The optical detection element of claim 1, wherein when a voltage is applied to the reset-gate electrode, the charges accumulated in the charge-readout region are exhausted to the reset-drain region so as to reset the charge-readout region.

3. The optical detection element of claim 1, wherein the charge-readout region is in contact with the buried charge-generation region.

4. The optical detection element of claim 1, wherein
   the charge-readout region is separated from the buried charge-generation region,
   a transfer-gate electrode is further stacked on the gate insulating film, allocated above the base-body region between the buried charge-generation region and the charge-readout region, and
   when a voltage is applied to the transfer-gate electrode, signal charges are transferred from the buried charge-generation region to the charge-readout region.

5. A solid-state image pickup device in which a plurality of pixels is arranged, each pixel comprising:
   a base-body region made of a semiconductor having a first conductivity type;
   a gate insulating film contacted with an upper surface of the base-body region;
   a buried charge-generation region of a second conductivity type buried with an annular form in an upper portion of the base-body region, being contacted with the gate insulating film;
   a charge-readout region of the second conductivity type having a higher impurity concentration than the buried charge-generation region, buried with an annular form in the upper portion of the base-body region at a position on an inner-contour side of the buried charge-generation region;
   a reset-drain region of the second conductivity type having a higher impurity concentration than the buried charge-generation region, buried in the upper portion of the base-body region at a position on the inner-contour side of the charge-readout region, being separated from the charge-readout region;
   a transparent electrode provided in an annular form on a gate insulating film, allocated above the buried charge-generation region; and
   a reset-gate electrode stacked on the gate insulating film, allocated above the base-body region between the charge-readout region and the reset-drain region,
   wherein in each of the plurality of arranged pixels, a surface potential in the surface portion of the buried charge-generation region is pinned by charges of minority carriers in the buried charge-generation region.

6. The solid-state image pickup device of claim 5, wherein in each of the pixels, when a voltage is applied to each of the reset-gate electrodes, the charges accumulated in each of the charge-readout regions are exhausted to the corresponding reset-drain region to reset the charge-readout region.

7. The solid-state image pickup device of claim 5, wherein the charge-readout region is in contact with the buried charge-generation region of each of the pixels.

8. The solid-state image pickup device of claim 5, wherein
   in each of the pixels, the charge-readout region is separated from the buried charge-generation region,
   a transfer-gate electrode is further stacked on the gate insulating film, allocated above the base-body region between the buried charge-generation region and the charge-readout region of each of the pixels, and in each of the pixels, when a voltage is applied to the transfer-gate electrode, signal charges are transferred from the buried charge-generation region to the charge-readout region.

* * * * *